(12) United States Patent
Fukumoto et al.

(10) Patent No.: US 7,582,923 B2
(45) Date of Patent: Sep. 1, 2009

(54) MAGNETIC MEMORY AND MANUFACTURING METHOD FOR THE SAME

(75) Inventors: Yoshiyuki Fukumoto, Tokyo (JP); Tetsuhiro Suzuki, Tokyo (JP); Katsumi Suemitsu, Tokyo (JP)

(73) Assignee: NEC Corporation, Tokyo (JP)

( * ) Notice: Subject to any disclaimer, the term of this patent is extended or adjusted under 35 U.S.C. 154(b) by 119 days.

(21) Appl. No.: 11/667,834

(22) PCT Filed: Nov. 16, 2005

(86) PCT No.: PCT/JP2005/021023

§ 371 (c)(1),
(2), (4) Date: May 16, 2007

(87) PCT Pub. No.: WO2006/054588

PCT Pub. Date: May 26, 2006

(65) Prior Publication Data

US 2008/0164502 A1 Jul. 10, 2008

(30) Foreign Application Priority Data

Nov. 16, 2004 (JP) ............................. 2004-332488

(51) Int. Cl.
*H01L 27/115* (2006.01)
(52) U.S. Cl. ............................... 257/295; 257/E27.104
(58) Field of Classification Search .................. 257/295
See application file for complete search history.

(56) References Cited

U.S. PATENT DOCUMENTS 6,005,800 A * 12/1999 Koch et al. .................. 365/173
6,292,352 B1 * 9/2001 Yamamichi .................. 361/311
6,483,741 B1 11/2002 Iwasaki et al.
6,970,376 B1 * 11/2005 Fukuzumi .................... 365/158
7,230,308 B2 * 6/2007 Iwata .......................... 257/421
7,394,626 B2 * 7/2008 Fukumoto et al. ......... 360/324.2
2002/0117727 A1 * 8/2002 Engel et al. .................. 257/421
2003/0012050 A1 1/2003 Iwasaki
2003/0103371 A1 6/2003 Kim et al.
2005/0106810 A1 * 5/2005 Pakala et al. ................. 438/257
2006/0003185 A1 * 1/2006 Parkin ..................... 428/692.1

FOREIGN PATENT DOCUMENTS

| JP | 2001-84756 | 3/2001 |
|----|------------|--------|
| JP | 2003-7980 | 1/2003 |
| JP | 2003-233983 | 8/2003 |
| JP | 2004-172599 | 6/2004 |
| JP | 2005-123488 | 5/2005 |
| JP | 2006-5356 | 1/2006 |

* cited by examiner

*Primary Examiner*—Sue Purvis
*Assistant Examiner*—Benjamin P Sandvik
(74) *Attorney, Agent, or Firm*—Young & Thompson

(57) ABSTRACT

The present invention to provide a new technique to reduce a variation in switching field of a magnetization free layer in a magnetic memory. The magnetic memory according to the present invention includes a magnetization free layer including a ferromagnetic layer having a shape magnetic anisotropy in a first direction and a magnetic strain constant is positive; and a stress inducing structure configured to apply a tensile stress to said magnetization free layer in a same direction as the first direction.

10 Claims, 34 Drawing Sheets

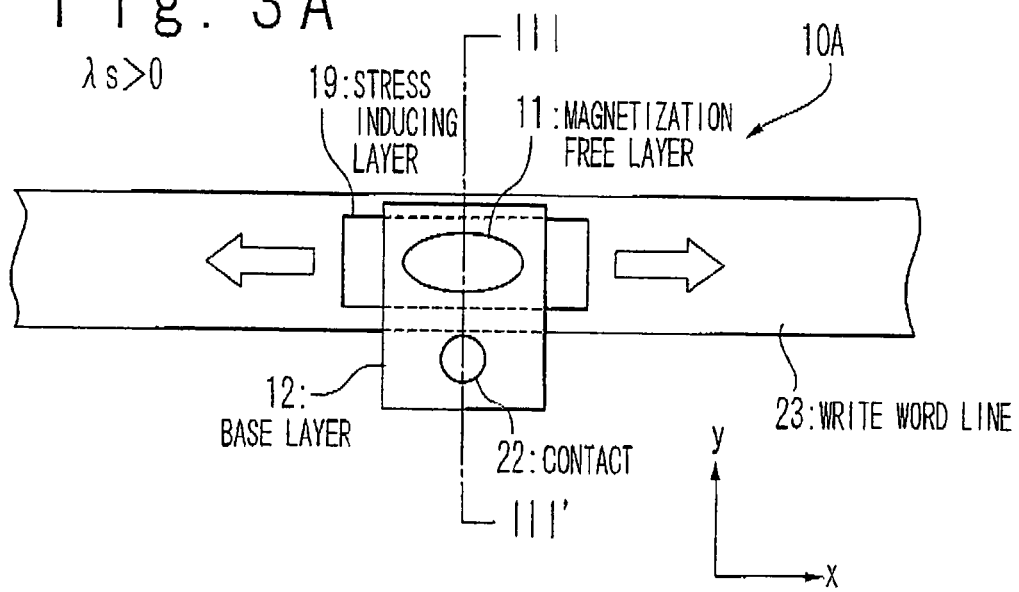
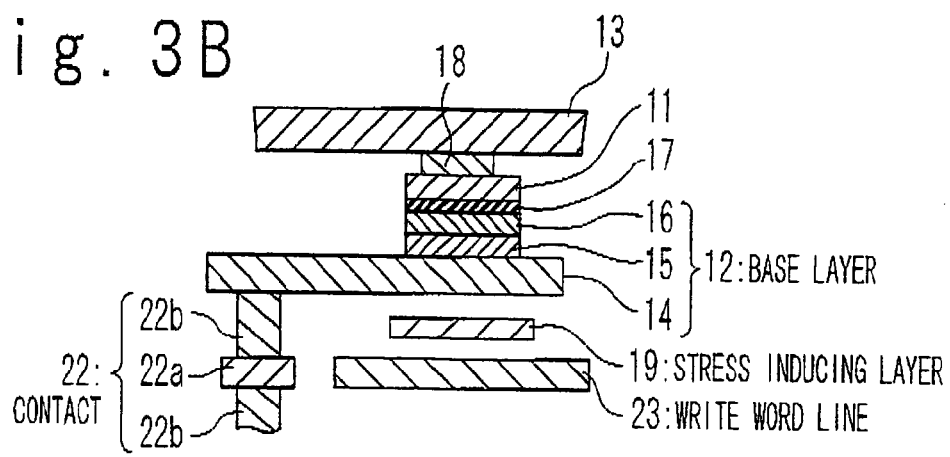
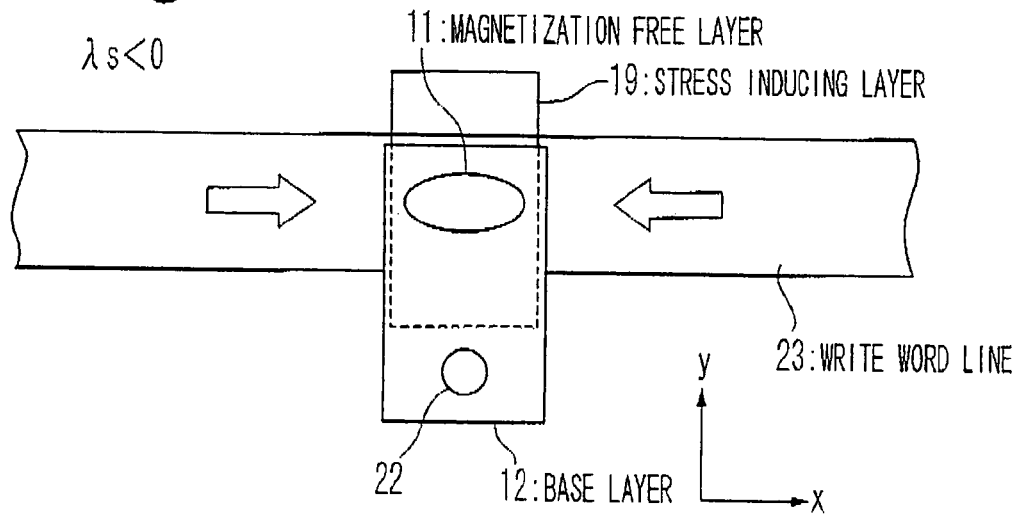

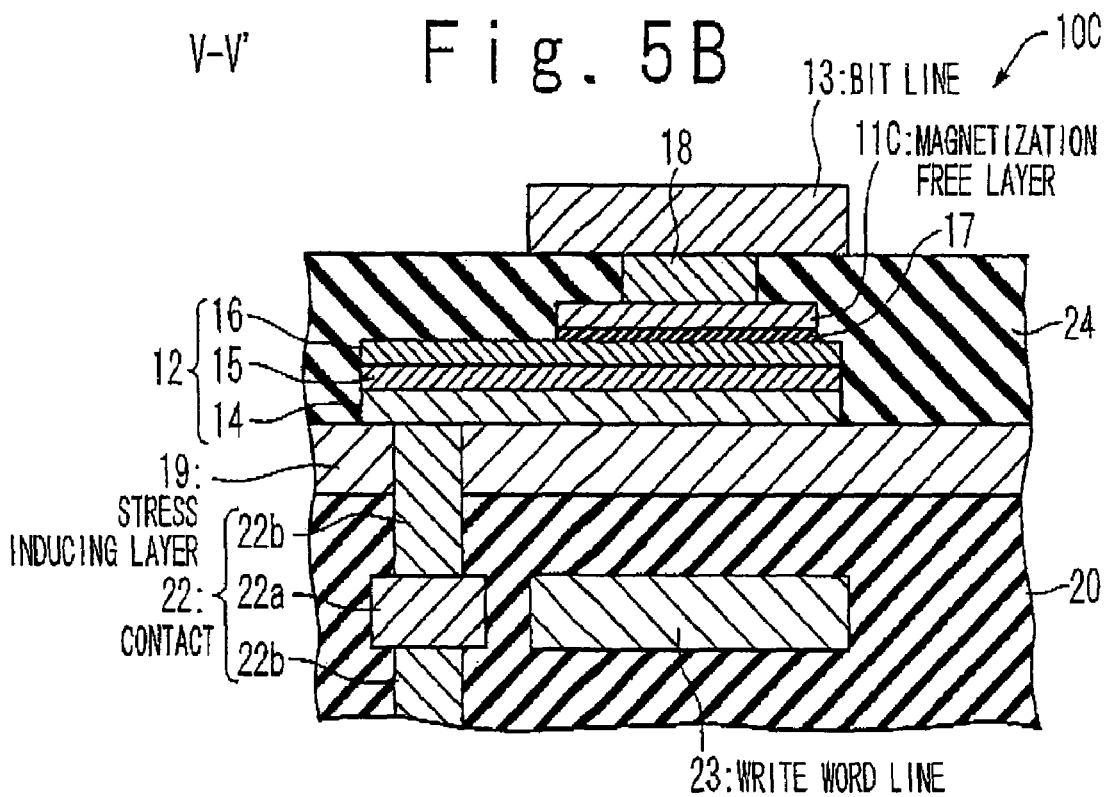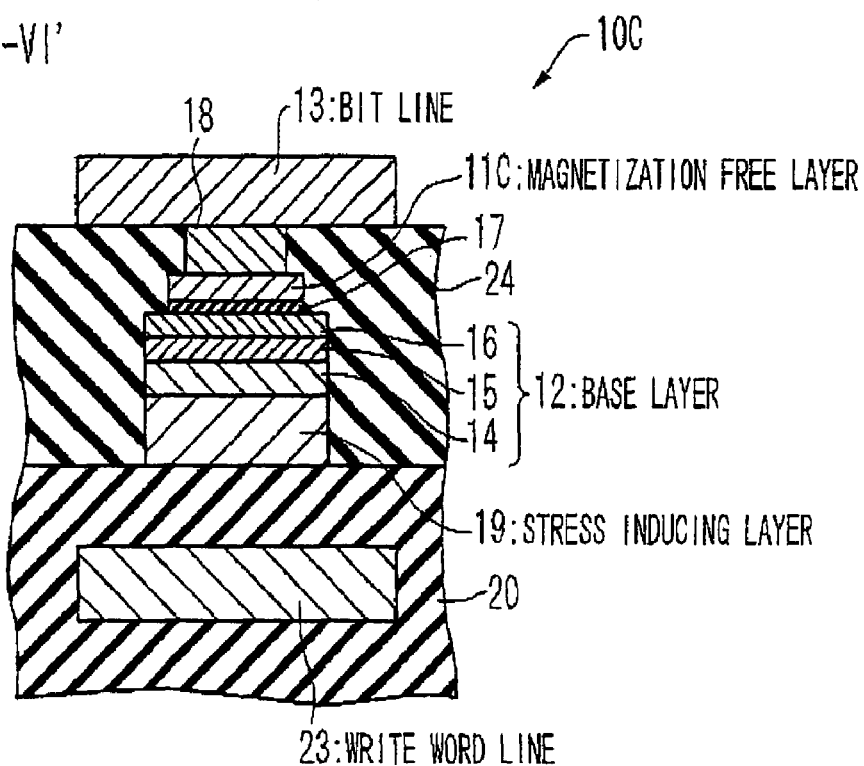

VII-VIII'

$K_{shape} // K_{stress}$ $K_{shape} \perp K_{stress}$

XVII-XVII'

MAGNETIC MEMORY AND MANUFACTURING METHOD FOR THE SAME

TECHNICAL FIELD

The present invention relates to a magnetic memory, and more particularly relates to a magnetic memory, which is designed such that a data is written into a magnetization free layer by a current flowing through a write wiring.

BACKGROUND ART

A magnetic memory that uses a spontaneous magnetization (herein after, to be merely referred to as "magnetization") of a ferromagnetic to store a data is one of nonvolatile memory devices to which the greatest attention has been paid in recent years. As a memory cell of the magnetic memory, for example, as disclosed in U.S. Pat. No. 5,650,958, a magnetic resistance element composed of two ferromagnetic layers is used which are separated by a non-magnetic layer of an conductor or insulator. One of the ferromagnetic layers of the two layers is designed such that the orientation of the magnetization is easily changed by an external magnetic field, and the other is designed such that the orientation of the magnetization is not easily changed. The former is often referred to as a magnetization free layer, and the latter is referred to as a magnetization pinned layer. The memory cell stores a digital data as a relative angle between the orientations of the magnetizations of the two ferromagnetic layers. The stored data is held for an extremely long period unless being intentionally rewritten.

When the data stored in the magnetic memory is read, a phenomenon that a resistance of the magnetic resistance element is based on the relative angle between the orientations of the magnetizations of the two ferromagnetic layers, a tunneling magneto-resistance (TMR) effect and a giant magneto-resistance (TMR) are used. The tunneling magneto-resistance effect is used when an insulating film is used as a non-magnetic layer, and the giant magneto-resistance effect is used when a conductive film is used as the non-magnetic layer.

On the other hand, the data write into the magnetic memory is performed such that a write current is sent to a wiring located near the memory cell, and a magnetic field exceeding a switching field is generated, and the orientation of the magnetization of the magnetization free layer is inverted to a desirable orientation by the magnetic field. The wiring used in the data write is often referred to as a word lines a bit line, and a digit line.

Most typically, the magnetization of the magnetization free layer is inverted to the desirable orientation by sending the write current to the orthogonal two write wirings. When the write current is sent to the two write wirings, a synthesis magnetic field is generated in a direction of 45° with respect to the easiness axis of the magnetization free layer. The magnetization of the magnetization free layer is inverted to the desirable orientation by the synthesis magnetic field.

It is possible to perform a data write by selectively flowing the write current to only a selection cell by a transistor, namely, by using one write wiring to invert the magnetization to the desirable orientation. In this case, the write wiring is preferably arranged to have the angle of 45° with respect to the easy axis of the magnetization free layer. This is because the write magnetic field becomes minimal. When the write current is supplied to the write wiring, magnetic field is generated in the direction of 45° with respect to the easy axis of the magnetization free layer. The magnetization of the magnetization free layer is inverted to the desirable orientation by this magnetic field. Hereinafter, this data write using the foregoing method is also referred to as one-axis write. Similarly, it is possible to cause a magnetization reversion by a spin torque by directly supplying a spin current to the magnetization free layer of the selection cell by a transistor. This is also referred to as a spin injection write. The spin injection write is high in cell selection property, similarly to the one-axis write.

In addition, as disclosed in U.S. Pat. No. 6,545,906, when the magnetization free layer has a laminated feri structure (namely, a structure having a plurality of ferromagnetic layers separated by a non-magnetic layer), the direction of the magnetic field applied to the magnetization free layer is rotated inside a plane so that the magnetization of the ferromagnetic layer of the magnetization free layer can be rotated in the desirable orientation. Specifically, the two orthogonal write wirings are extensively arranged such that both have the angles of 45° with respect to the easy axis of the magnetization free layer. Hereinafter, one of the two write wirings is described as a word line, and the other is described as a bit line. In the data write, the write current is first supplied to the word line, to generate the magnetic field in the direction orthogonal to the word line. In succession, the write current is sent to the bit line in a state that the write current is supplied to the word line. Consequently, a magnetic field is generated in a direction oblique to each of the word line and the bit line, typically, in the direction of the angle of 45° with respect to the word line and the bit line. Moreover, in succession, the supply of the write current to the word line is stopped in a state that the write current is supplied to the bit line. Thus, the magnetic field is generated in the direction orthogonal to the bit line (namely, a direction parallel to the word line). In the above process, the write currents are supplied to the word line and the bit line, so that the magnetic field applied to the magnetization free layer is rotated, which can rotate the magnetization of the ferromagnetic layer of the magnetization free layer by 180°. The above data write is also referred to as a toggle write hereinafter.

One of the severest problems in the magnetic memory is a variation in magnetic field for reversion of magnetization of the magnetization free layer, i.e., a switching field. When the variation in the switching field of the magnetization free layer is great, the cells are grouped into write enable memory cells and write disable memory cells in a particular write current. This is inconvenient for the operation of the magnetic memory.

In particular, when the data write is performed by supplying the write current to the two write wirings orthogonal to each other, the variation in the switching field of the magnetization free layer is important. The variation in the switching field of the magnetization free layer decreases a margin of the write current and may bring about a situation that the data is erroneously written to the non-selected memory cell. Also, in the method in which the transistor is used to select the cell, the increase in the variation in the switching field causes the increase in the write current.

One method to suppress the variation in the switching field of the magnetization free layer is to form the magnetization free layer long, namely, make an aspect ratio of the magnetization free layer high. Here, the aspect ratio is a value defined as d/W when a length in a longitudinal direction of the magnetization free layer is assumed to be d and a length in a width direction orthogonal to the longitudinal direction is assumed to be W. Since the aspect ratio is made high, the shape magnetic anisotropy of the magnetization free layer can be increased, to suppress the variation in the switching field of the magnetization free layer.

However, the increase in the aspect ratio of the magnetization free layer is not preferable because the size of the memory cell of the magnetic memory is increased. In particular, in the spin injection write, the decrease in the area of the magnetization free layer is important because this increases the write current density and reduces the write current. In order to make the memory cell of the magnetic memory small, the aspect ratio of the magnetization free layer is desired to be 2.0 or less. However, a method of suppressing a variation in the switching field of the magnetization free layer when the aspect ratio of the magnetization free layer is 2.0 or less is not known.

DISCLOSURE OF INVENTION

It is therefore an exemplary object of the present invention to provide a new technique to reduce a variation in switching field of a magnetization free layer in a magnetic memory and preferably, to provide a technique that can reduce a variation in the switching field of the magnetization free layer, while making the size of the memory cell small.

The present invention is based on opinions by the inventor where one reason of the variation in the switching field of the magnetization free layer lies in the difference between a stress inducing magnetic anisotropy and the shape magnetic anisotropy. When the directions of the stress inducing magnetic anisotropy and the shape magnetic anisotropy are different, a pinion of a wall movement (wall motion pinning) is strongly generated which brings about the variation in the switching field of the magnetization free layer.

The present invention makes the direction of the stress inducing magnetic anisotropy close to the direction of the shape magnetic anisotropy, and ideally makes them coincident and consequently suppresses the variation in the switching field of the magnetization free layer. The direction of the stress inducing magnetic anisotropy can be controlled in accordance with the magnetic strain constant of the magnetization free layer and the polarity of the stress applied to the magnetization free layer and the method.

In an exemplary aspect of the present invention, the magnetic memory includes a magnetization free layer including a ferromagnetic layer which has a shape magnetic anisotropy in a first direction and whose magnetic strain constant is positive; and a stress inducing structure that applies a tensile stress to the magnetization free layer in a same direction as the first direction. With the operation of the stress inducing structure, in the magnetization free layer, the stress inducing magnetic anisotropy is generated in a direction close to the direction of the shape magnetic anisotropy, ideally, in a same direction as a direction of the shape magnetic anisotropy. This is effective for suppressing a variation in the switching field of the magnetization free layer.

In one embodiment, in the stress inducing structure, its inner stress is the tensile stress, and this is formed to extend in the first direction. Also, in the stress inducing structure, its inner stress is a compression stress, and this can be even formed to extend in a second direction orthogonal to the first direction.

In another exemplary aspect, the magnetic memory according to the present invention, the magnetization free layer has the shape magnetic anisotropy in the first direction and contains: formed of including the ferromagnetic layer whose magnetic strain constant is negative; and the stress inducing structure that applies the tensile stress in the same direction as the first direction to the magnetization free layer. Even such structure, the stress inducing magnetic anisotropy is generated in the direction close to the direction of the shape magnetic anisotropy, ideally, in a same direction as the direction of the shape magnetic anisotropy, and the variation in the switching field of the magnetization free layer can be suppressed.

In this case, in the stress inducing structure, its inner stress is the tensile stress, and this can be formed to extend in the second direction orthogonal to the first direction. Also, in the other embodiment, in the stress inducing structure, its inner stress is the compression stress, and this is formed to extend in the first direction.

When the magnetic memory further includes a spacer layer; and a base layer having the magnetization pinned layer that is provided to be opposite to the magnetization free layer with the spacer layer, the stress inducing structure preferably includes a stress inducing layer that is provided differently from the base layer.

In addition, when the magnetic memory includes a substrate (not shown) on which the magnetization free layer and the stress inducing layer are formed; and a lower wiring which is arranged between the magnetization free layer and the substrate and through which a write current to invert the magnetization of the magnetization free layer is sent, the stress inducing layer is preferably provided differently from the low wiring.

Also, the base layer containing the magnetization pinned layer that is provided oppositely to the magnetization free layer with the space layer between can be used as the stress inducing structure that applies a desirable stress to the magnetization free layer.

Also, when the base layer is formed to extend in a third direction oblique to the first direction, a protrusion protruding in the direction orthogonal to the third direction is formed on the base layer, and this protrusion is preferably used as the stress inducing structure that applies the desirable stress to the magnetization free layer.

When the magnetization free layer has the positive magnetic strain constant, the lower wiring, which is arranged between the magnetization free layer and the substrate and extend in the first direction and through which the write current to invert the magnetization of the magnetization free layer is sent, can be used as the stress inducing structure. On the other hand, when the magnetization free layer has the negative magnetic strain constant, the lower wiring, which is arranged between the magnetization free layer and the substrate and extended in the second direction orthogonal to the first direction and through which the write current to invert the magnetization of the magnetization free layer is sent, can be used as the stress inducing structure.

When the write wiring through which the write current to invert the magnetization of the magnetization free layer is arranged in the direction different from the first direction, the magnetic memory preferably contains another stress inducing structure that applies the stress of the direction opposite to the stress, which is applied to the magnetization free layer, to the magnetization free layer.

In order to reduce the variation in the switching field of the magnetization free layer while decreasing the size of the memory cell, the magnetization free layer is preferably formed such that the aspect ratio of the magnetization free layer is 2 or less and the ratio of the shaped anisotropy magnetic field to the stress inducing anisotropy magnetic field of the magnetization free layer is 0.5 or more. Here, the aspect ratio of the magnetization free layer is the value defined by the d/W by using the length d of the first direction and the width W of the second direction orthogonal to the first direction.

Also, in order to further reduce a variation in the switching field of the magnetization free layer, in the magnetization free layer, its stress inducing anisotropy magnetic field and shape anisotropy magnetic field have no correlation, and a parameter r defined in the following equation (1) by using an average value $A_{SH}$ of the shaped anisotropy magnetic fields and an average value $A_{STR}$ of the stress inducing anisotropy magnetic fields, and $b_{ST}$, $b_{SH}$ defined in the following equations (2a), (2b), respectively, by using a standard deviation $\sigma_{ST}$ of the stress inducing anisotropy magnetic field and a standard deviation $\sigma_{SH}$ of the shaped anisotropy magnetic field preferably establish the following equation (3).

$$r = A_{SH}/(A_{STR} + A_{SH}) \tag{1}$$

$$b_{ST} = \sigma_{ST}/A_{ST} \tag{2a}$$

$$b_{SH} = \sigma_{SH}/A_{SH} \tag{2b}$$

$$r = b_{ST}^2/(b_{ST}^2 + b_{SH}^2) \tag{3}$$

In another aspect, the magnetic memory has the plurality of magnetization free layers. The anisotropic magnetic fields resulting from the two magnetic anisotropies selected from the stress inducing anisotropy, shaped anisotropy and crystal magnetic anisotropy in the magnetization free layer have no correlation to each other. In addition, a parameter r defined in the following equation (1') by using an average value $A_X$ of the anisotropic magnetic fields resulting from one magnetic anisotropy of the two magnetic anisotropies and an average value $A_Y$ of the anisotropic magnetic field resulting from the other magnetic anisotropy, and $b_X$ and $b_Y$ defined in the following equations (2a'), (2b'), respectively, by using the standard deviation $\sigma_{ST}$ of the stress inducing anisotropy magnetic field and the standard deviation $\sigma_{ST}$ of the shaped anisotropy magnetic field establish the following equation (3).

$$r = A_Y/(A_X + A_Y) \tag{1'}$$

$$b_X = \sigma_X/A_X \tag{2a'}$$

$$b_Y = \sigma_Y/A_y \tag{2b'}$$

$$r = b_X^2/(b_X^2 + b_Y^2) \tag{3}$$

Such configuration is preferable in order to further reduce the variation in the switching field of the magnetization free layer.

According to the present invention, it is possible to make the direction of the stress inducing magnetic anisotropy close to the direction of the shape magnetic anisotropy and ideally make both of them coincident and consequently suppress the variation in the switching field of the magnetization free layer.

BRIEF DESCRIPTION OF DRAWINGS

FIG. 3A is a plan view showing a fourth structure of the magnetic memory according to the first embodiment of the present invention;

FIG. 3B is a sectional view showing the fourth structure of the magnetic memory according to the first embodiment of the present invention;

FIG. 3C is a plan view showing a fifth structure of the magnetic memory according to the first embodiment of the present invention;

FIG. 5B is a sectional view showing the eighth structure of the magnetic memory according to the first embodiment of the present invention;

FIG. 5C is a sectional view showing the eighth structure of the magnetic memory according to the first embodiment of the present invention;

FIG. 6I is a sectional view showing the manufacturing step of the magnetic memory shown in FIG. 5A to FIG. 5C;

BEST MODE OF CARRYING OUT THE INVENTION

Figure 1A:
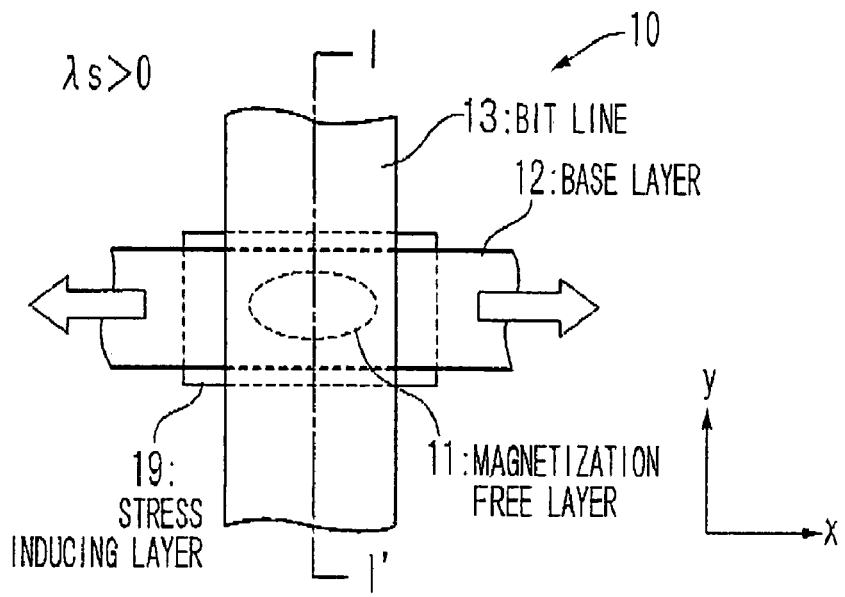
FIG. 1A is a plan view showing a first structure of a magnetic memory according to a first embodiment of the present invention.

Hereinafter, the present invention will be described in detail with reference to the attached drawings. It should be noted that same, similar or corresponding components are referred to by use of the same or corresponding reference numerals or symbols on the attached drawings.

As mentioned above, in order to suppress a variation in switching field, it is preferable that a direction of stress inducing magnetic anisotropy is made close to a direction of a shape magnetic anisotropy. Ideally, they are preferably made coincident. A technique for optimally controlling the directions of the stress inducing magnetic anisotropy and a shape magnetic anisotropy will be schematically described below. Hereinafter, in order to easily show the structure of the magnetic memory in the embodiment of the present invention, an xy orthogonal coordinate system is introduced. It should be noted that an x-axis direction and a y-axis direction are orthogonal to each other.

FIRST EMBODIMENT

FIG. 1A is a plan view showing a configuration of a magnetic memory cell 10 of the magnetic memory according to the first embodiment of the present invention. As shown in FIG. 1A, the magnetic memory cell 10 is formed as a cross point memory array, and specifically, a memory cell contains a magnetization free layer 11 for holding a data, a base layer 12 functioning as a word line, and a bit line 13. The magnetization free layer 11 has a shape that is long in the x-axis direction, and its shape magnetic anisotropy is oriented to the x-axis direction. The base layer 12 is provided to extend in the x-axis direction, and the bit line 13 is provided to extend in the y-axis direction. The data write into the magnetization free layer 11 is performed by supplying a write current to the base layer 12 and the bit line 13.

Figure 1B:
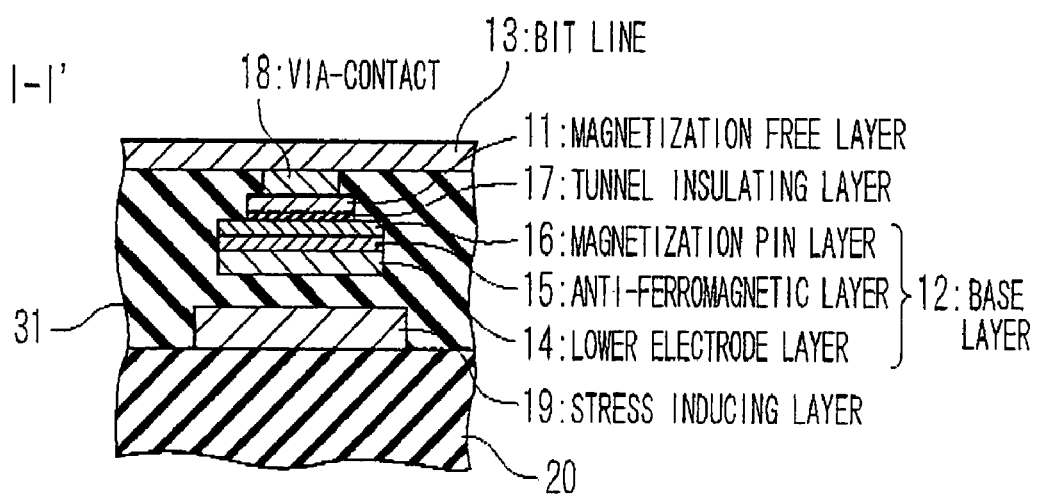
FIG. 1B is a sectional view showing the first structure of the magnetic memory according to the first embodiment of the present invention.

As shown in FIG. 1B, the base layer 12 includes a lower electrode layer 14, an anti-ferromagnetic layer 15 and a magnetization pinned layer 16. The anti-ferromagnetic layer 15 plays a role to fix the magnetization of the magnetization pinned layer 16 through an exchanging mutual action. The magnetization pinned layer 16 is joined to the magnetization free layer 11 through a tunnel insulating layer 17. The tunnel insulating layer 17 is a non-magnetic and insulating spacer that is formed between the magnetization free layer 11 and the magnetization pinned layer 16. The magnetization free layer 11, the magnetization pinned layer 16 and the tunnel insulating layer 17 function as MTJ (Magnetic Tunnel Junction). It should be noted that the base layer implies a layer that the tunnel insulating layer and the magnetization free layer are formed directly thereon in this specification. The magnetization free layer 11 is connected through a via-contact 18 to the bit line 13. The base layer 12, the tunnel insulating layer 17 and the magnetization free layer 11 are coated with an interlayer insulating film 31.

In order to make the orientation of the stress inducing magnetic anisotropy of the magnetization free layer 11 coincident with the orientation of the shape magnetic anisotropy, the polarity of a magnetic strain constant $\lambda s$ of the magnetization free layer 11 and the orientation of the stress applied to the magnetization free layer 11 are optimized in the magnetic memory cell 10 of this embodiment.

Specifically, as shown in FIG. 1A, the magnetization free layer 11 is formed of a ferromagnetic material in which the magnetic strain constant $\lambda s$ is positive, and a stress inducing layer 19 that performs a tensile stress in the x-axis direction on the magnetization free layer 11 is further formed on an interlayer insulating layer 20. Since the tensile stress is applied in the x-axis direction on the magnetization free layer 11 in which the magnetic strain constant $\lambda s$ is positive, the stress inducing magnetic anisotropy is generated in the x-axis direction. Thus, the orientation of the shape magnetic anisotropy can be made coincident with the orientation of the shape magnetic anisotropy.

In this embodiment, the stress inducing layer 19 is formed of same conductive material as a wiring layer that is arranged between the base layer 12 and a substrate in a same wiring layer. According to the experiment of the inventor, the wiring provided between the base layer 12 and the substrate applies the tensile stress in the same direction as the extension direction of the wiring to the magnetization free layer 11 and applies the compression stress in the direction orthogonal to the extension direction of the wiring to the magnetization free layer 11. Thus, in this embodiment, the stress inducing layer 19 has the shape which is long in the x-axis direction. Therefore, the tensile stress in the x-axis direction is applied to the magnetization free layer 11. The stress inducing layer 19 may be formed of an insulator. In this case, since the stress inducing layer 19 can function as the interlayer insulating layer, the base layer 12 can be directly joined on the stress inducing layer 19.

Figure 1C:
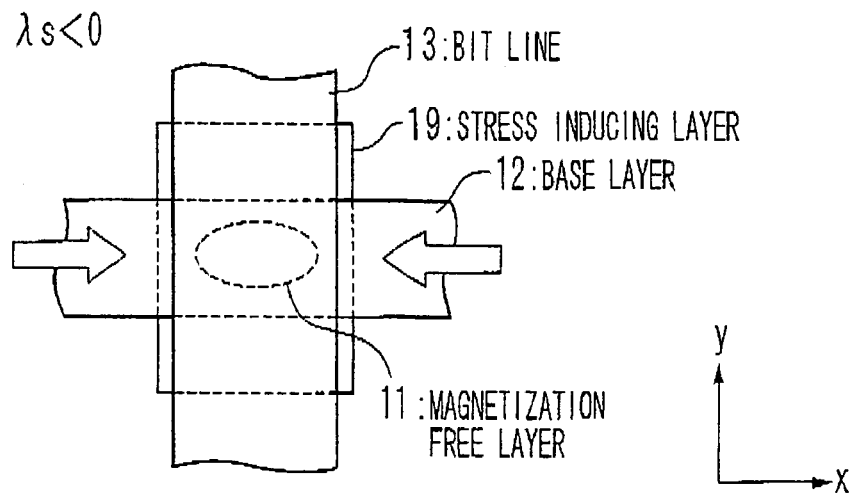
FIG. 1C is a plan view showing a second structure of the magnetic memory according to the first embodiment of the present invention.

The magnetization free layer 11 may be formed of the ferromagnetic material whose magnetic strain constant $\lambda s$ becomes negative. In this case, as shown in FIG. 1C, the stress inducing layer 19 is configured such that the compression stress in the x-axis direction is applied to the magnetization free layer 11. Specifically, the stress inducing layer 19 is formed of a conductor of the same wiring layer as the AlCu wiring which is provided between the base layer 12 and the substrate so that its shape is long in the y-axis direction. The thus-formed stress inducing layer 19 generates the stress inducing magnetic anisotropy in the s-axis direction and makes the direction of the stress inducing magnetic anisotropy coincident with the direction of the shape magnetic anisotropy.

Figure 2A:
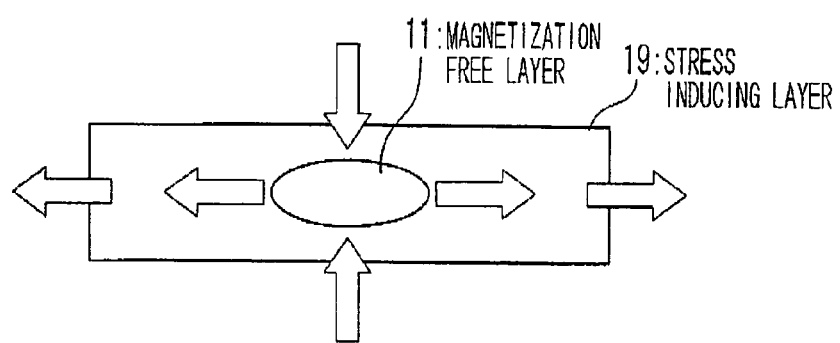
FIG. 2A is a concept view showing a direction of a stress applied to a magnetization free layer, when an inner stress of a stress inducing layer is a compression stress.
Figure 2B:
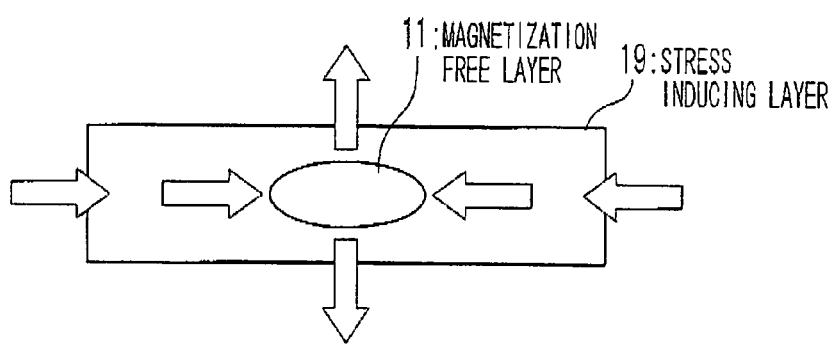
FIG. 2B is a concept view showing the direction of the stress applied to the magnetization free layer, when the inner stress of the stress inducing layer is the compression stress.

As the generation mechanism of the stress that is applied to the magnetization free layer 11 by the stress inducing layer 19, the inner stress of the stress inducing layer 19 can be used. In this case, the direction of the stress that is applied to the magnetization free layer 11 by the stress inducing layer 19 can be controlled on the basis of the polarity of the inner stress of the stress inducing layer 19 and the shape of the stress inducing layer 19. As shown in FIG. 2A, when the inner stress of the stress inducing layer 19 is the tensile stress, the tensile stress is applied in the same direction as the longitudinal direction of the stress inducing layer 19 to the magnetization free layer 11, and the compression stress is applied in the direction orthogonal to the longitudinal direction of the stress inducing layer 19. On the other hand, as shown in FIG. 2B, when the inner stress of the stress inducing layer 19 is the compression stress, the situation becomes opposite. The magnitude of the stress applied to the magnetization free layer 11 can be controlled on the basis of the thickness of the stress inducing layer 19.

The source of the inner stress of the stress inducing layer 19 may be any of the intrinsic inner stress caused by a film forming condition and the inner stress caused by a thermal stress. Typically, in order to form the film where the intrinsic inner stress is in the compressed direction, the film may be formed such that the density becomes high. In a sputter method that can get the delicate film, typically, the film having the intrinsic inner stress in the compression direction is formed in many cases oppositely, in order to form the film having the stress in the tensile direction, the film may be formed such that the density is low and it is poor. Specifically, the manners of increasing a sputter pressure and decreasing a discharging electric power and the like may be listed. Also, the thermal stress can be used to form the film in which the inner stress is in the tensile direction. Specifically, the film may be made of the material having an expansion coefficient greater than the layer of its ground (the interlayer insulating layer, in many cases), and the substrate is grown while heated.

The direction in which the stress inducing layer 19 extends is optimally selected on the basis of the polarity of a magnetic strain constant of the magnetization free layer 11 and the polarity of the inner stress of the stress inducing layer 19. Specifically, (a) when the magnetization free layer 11 is made of a material whose magnetic strain constant is positive and the inner stress of the stress inducing layer 19 is tensile-stress, and (b) when the magnetization free layer 11 is made of a material whose magnetic strain constant is negative and the inner stress of the stress inducing layer 19 is compression stress, the stress inducing layer 19 is formed to extend in the same direction as the longitudinal direction of the magnetization free layer 11. On the other hand, (c) when the magnetization free layer 11 is made of a material whose magnetic strain constant is positive and the inner stress of the stress inducing layer 19 is compression stress and (d) when the magnetization free layer 11 is made of a material whose magnetic strain constant is negative and the inner stress of the stress inducing layer 19 is tensile stress, the stress inducing layer 19 is formed to extend in the direction orthogonal to the longitudinal direction of the magnetization free layer 11.

Figure 1D:
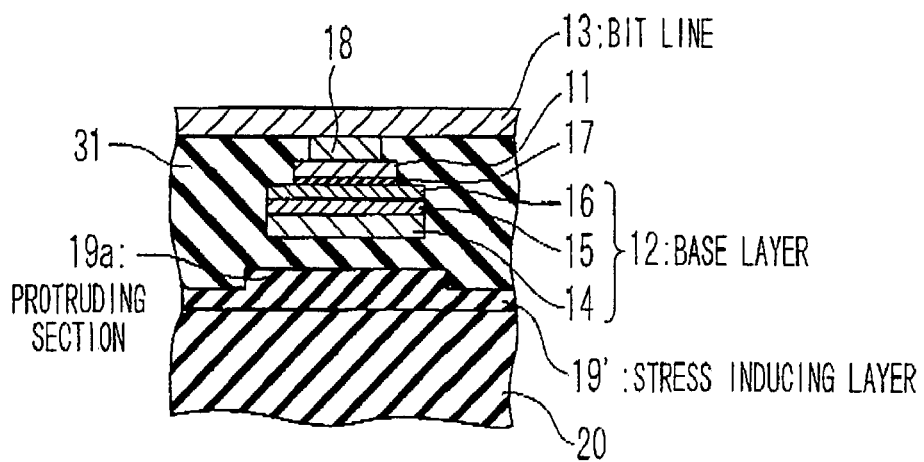
FIG. 1D is a sectional view showing a third structure of the magnetic memory according to the first embodiment of the present invention.

In order to allow the easy adjustment of the stress applied to the magnetization free layer 11, a stress inducing layer 19' is preferably used, a part of which is etched from the surface in the film thickness direction as shown in FIG. 1D. A protrusion section 19a of the stress inducing layer 19' plays a role of applying a stress to the magnetization free layer 11, similarly to the stress inducing layer 19. The magnitude of the stress applied to the magnetization free layer 11 can be adjusted in accordance with the etched depth, namely, the height of the protrusion section 19a. The direction in which the protrusion section 19a extends is optimally selected on the basis of the polarity of the magnetic strain constant of the magnetization free layer 11 and the polarity of the inner stress of the stress inducing layer 19', similarly to the stress inducing layer 19 as mentioned above.

Moreover, as another means for controlling the magnitude of the stress, there is a control of the thickness of the interlayer insulating layer between the stress inducing layer 19 (or 19') and the base layer 12. As the thickness of the interlayer insulating layer becomes thinner, the relaxation of the stress generated from the stress inducing layer becomes small. As a result, the great stress can be applied to the magnetization free layer 19 of the MJT. Thus, the stress inducing magnetic anisotropy is increased.

The use of the stress inducing layer is effective even when the magnetic memory has a configuration other than the cross point memory array. For example, as shown in FIGS. 3A and 3B, the stress inducing layer can be applied to even a magnetic memory cell 10A in which a selection transistor is prepared for every MTJ. The configuration of the magnetic memory cell 10A shown in FIGS. 3A and 3B will be described below in detail.

As shown in FIG. 3A, the magnetic memory cell 10A includes the magnetization free layer 11 having shape magnetic anisotropy in the x-axis direction; the base layer 12 having a shape long in the y-axis direction; a contact 22 for connecting the base layer 12 to the selection transistor (not shown) formed on the surface of the substrate; and a write word line 23 extending in the x-axis direction, and a bit line 13 extending in the y-axis direction as shown in FIG. 2B. The write of the data is performed by supplying the write current to the bit line 13 and the write word line 23. However, it should be noted that the bit line 13 is not shown in FIG. 3A.

As shown in FIG. 3B, the base layer 12 includes the lower electrode layer 14, the anti-ferromagnetic layer 15 and the magnetization pinned layer 16. The magnetization pinned layer 16 is connected through the tunnel insulating layer 17 to the magnetization free layer 11, and MTJ is formed of the magnetization free layer 11, the magnetization pinned layer 16 and the tunnel insulating layer 17. The contact 22 is composed of a land 22a and via-contacts 22b and 22c. The land 22a is formed in a same wiring layer as the write word line 23. The via-contact 22b is provided between the land 22a and the base layer 12, and the via-contact 22c is provided between the land 22a and the selection transistor.

In order to make a direction of the stress inducing magnetic anisotropy coincident with the direction of the shape magnetic anisotropy (namely, the x-axis direction), the magnetization free layer 11 is made of a ferromagnetic material in which the magnetic strain constant $\lambda s$ is positive. Moreover, the stress inducing layer 19 for applying tensile stress to the magnetization free layer 11 in the x-axis direction is formed between the write word line 23 and the base layer 12. The stress inducing layer 19 is formed in the wiring layer between the write word line 23 and the base layer 12 and has the shape long in the x-axis direction. When the magnetization free layer 11 is made of a ferromagnetic material in which the magnetic strain constant $\lambda s$ is negative, as shown in FIG. 2C, the stress inducing layer 19 is formed so as to have the shape so that the compression stress in the x-axis direction is applied to the magnetization free layer 11, specifically, to have the shape long in the x-axis direction.

The use of the stress inducing layer 19 is especially effective when the write wiring supplied with the write current is arranged obliquely into a direction of the shape magnetic anisotropy of the magnetization free layer 11, for example, when one-axis write or a toggle write is employed. The write wiring affects stress to the magnetization free layer 11 into a direction of extension of the write wiring, or a direction orthogonal to it. Thus, when the write wiring is arranged obliquely into the direction of the shape magnetic anisotropy, the direction of the stress inducing magnetic anisotropy becomes oblique to the direction of the shape magnetic anisotropy. The use of the stress inducing layer 19 suppress the influence of the stress caused by the write wiring. Since the stress inducing layer 19 is provided, the direction of the stress inducing magnetic anisotropy can be made close to the direction of the shape magnetic anisotropy.

Figure 4A:
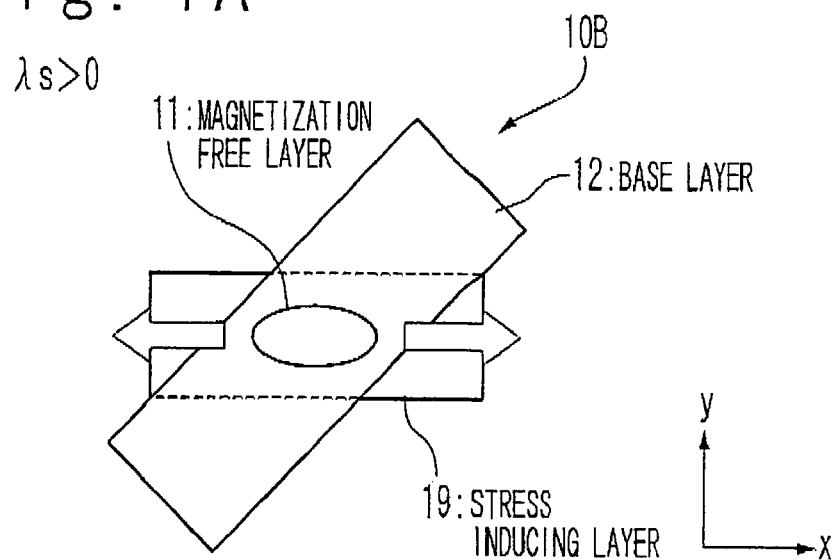
FIG. 4A is a plan view showing a sixth structure of the magnetic memory according to the first embodiment of the present invention.
Figure 4B:
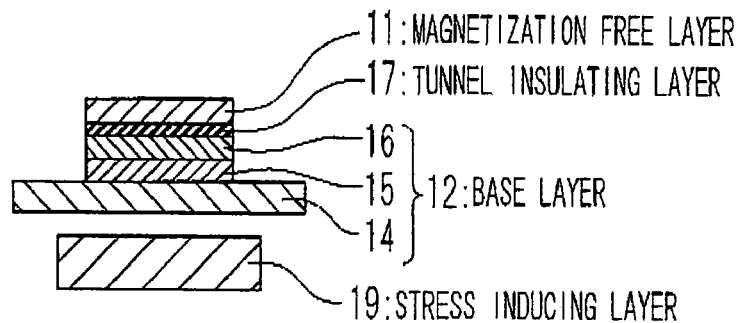
FIG. 4B is a sectional view showing the sixth structure of the magnetic memory according to the first embodiment of the present invention.
Figure 4C:
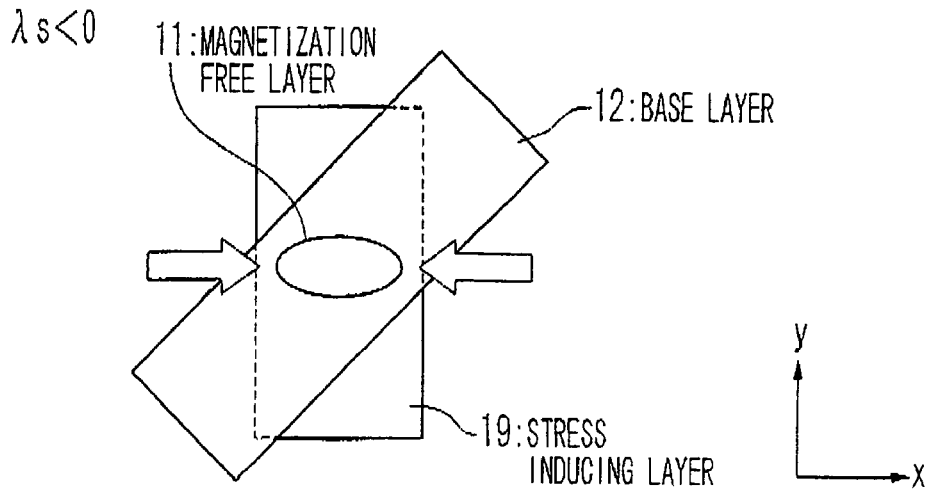
FIG. 4C is a plan view showing a seventh structure of the magnetic memory according to the first embodiment of the present invention.

FIGS. 4A and 4B show the configuration of a memory cell 10B of a magnetic memory that employs the one-axis write. As shown in FIG. 4A, in the magnetic memory cell 10B, the base layer 12 is formed to have a shape extending in the direction of 45° with respect to both of the x-axis direction and the y-axis direction. The magnetization free layer 11 has a shape long in the x-axis direction, and its shape magnetic anisotropy is oriented to the x-axis direction. The magnetization free layer 11 is formed such that the magnetic strain constant $\lambda s$ is positive. Moreover, the stress inducing layer 19 is formed to have a shape so that the tensile stress in the x-axis direction is applied to the magnetization free layer 11, specifically, to have the shape that is long in the x-axis direction. Consequently, the direction of the stress inducing magnetic anisotropy of the magnetization free layer 11 is adjusted to be parallel to the direction of the shape magnetic anisotropy. When the magnetic strain constant $\lambda s$ of the magnetization free layer 11 is negative, as shown in FIG. 4C, the stress inducing layer 19 is formed to have a shape so that the compression stress in the x-axis direction is applied to the magnetization free layer 11, specifically, to have a shape that is long in the y-axis direction.

Figure 5A:
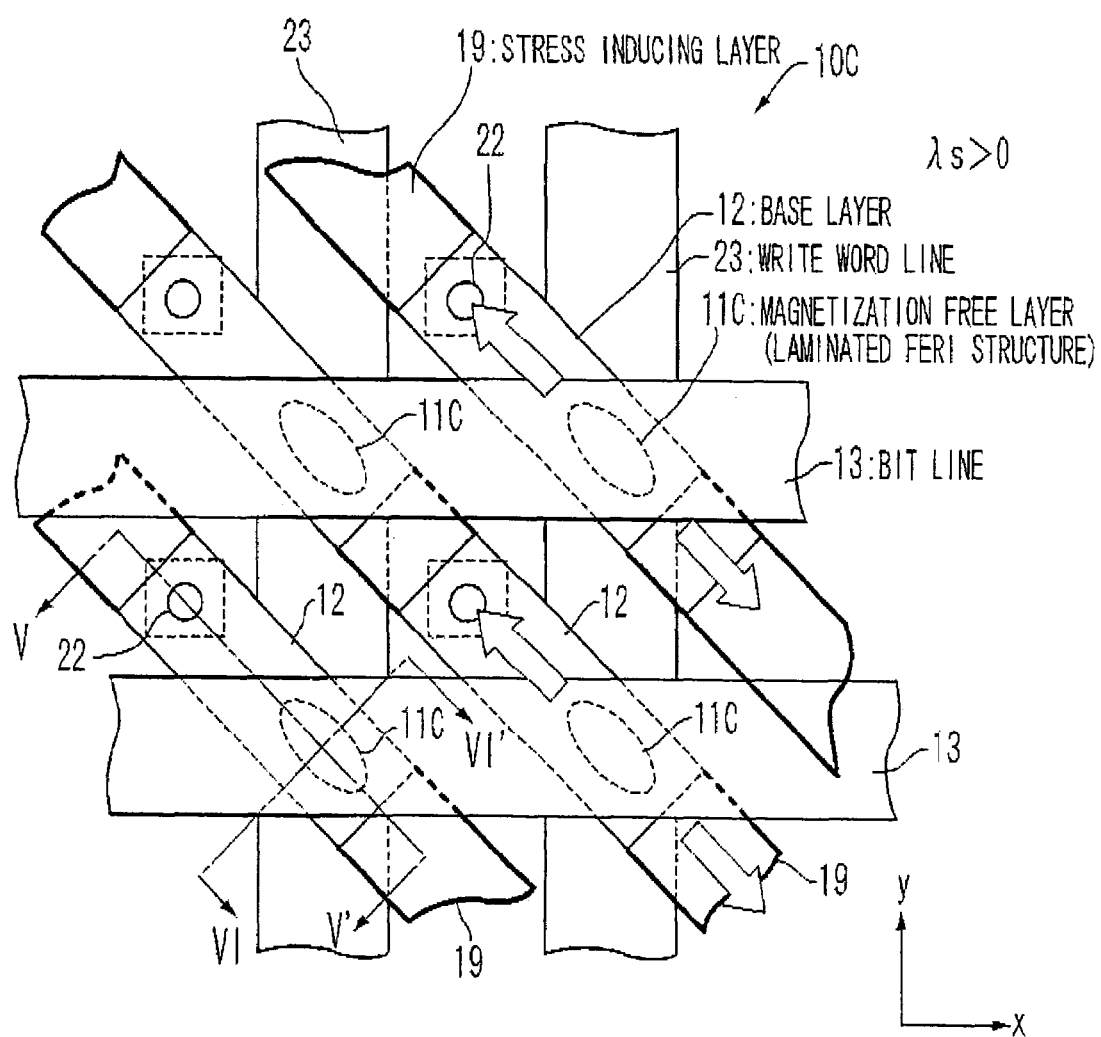
FIG. 5A is a plan view showing an eighth structure of the magnetic memory according to the first embodiment of the present invention.

On the other hand, FIGS. 5A to 5C show the configuration of a memory cell 10C of a magnetic memory that employs the toggle write. As shown in FIG. 5A, in the magnetic memory cell 10C, the bit line 13 extends in the x-axis direction, and the write word line 23 extends in the y-axis direction. The magnetization free layer 11C and the base layer 12 are formed at the position in which the bit line 13 and the write word line 23 intersect each other. As the magnetization free layer 11C, a laminated feri structure formed from a plurality of ferromagnetic layers separated by non-magnetic layers is used. The magnetization free layer 11C has a shape that is long in the direction of 45° with respect to both of the x-axis direction and the y-axis direction. Thus, the shape magnetic anisotropy of the magnetization free layer 11C is the direction of 45° with respect to both of the x-axis direction and the y-axis direction. As shown in FIGS. 5B and 5C, the write word line 23 is embedded in the interlayer insulating layer 20, and the stress inducing layer 19 is formed on the interlayer insulating layer 20. The base layer 12 is formed on the stress inducing layer 19. In the configuration shown in FIG. 5A, a plurality of base layers 12 are formed on a single stress inducing layer 19. In order to electrically separate the plurality of base layers 12 formed on the single stress inducing layer 19, the stress inducing layer 19 is made of insulator. The base layer 12 includes the lower electrode layer 14, the anti-ferromagnetic layer 15 and the magnetization pinned layer 16. The magnetization pinned layer 16 is coupled through the tunnel insulating layer 17 to the magnetization free layer 11C. The base layer 12 is connected through the contact 22 to a selection transistor (not shown) formed on the substrate. The contact 22 is composed of a land 22a and via-contacts 22b and 22c.

In order to adjust the direction of the stress inducing magnetic anisotropy of the magnetization free layer 11C to a direction close to the direction of the shape magnetic anisotropy, the ferromagnetic layer is formed in which the magnetization free layer 11C is made of a material whose magnetic strain constant is positive, and the stress inducing layer 19 is formed below the base layer 12. The stress inducing layer 19 is formed to apply the tensile stress to the magnetization free layer 11C in a direction parallel to the longitudinal direction of the magnetization free layer 11C and to apply the compression stress to the magnetization free layer 11C in a direction orthogonal to the longitudinal direction. Specifically, the stress inducing layer 19 is formed such that it extends in a same direction as the longitudinal direction of the magnetization free layer 11C (namely, the direction of 45° with respect to both of the x-axis direction and the y-axis direction) and its inner stress is the tensile stress. The fact that the thus-formed stress inducing layer 19 applies the tensile stress into the longitudinal direction of the magnetization free layer 11C could be understood from the foregoing discussion.

Figure 6A:
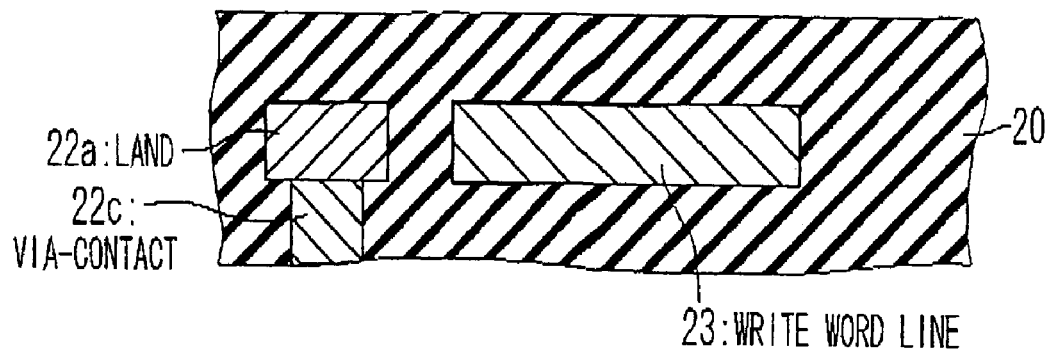
FIG. 6A is a sectional view showing a manufacturing step of the magnetic memory shown in FIG. 5A to FIG. 5C.
Figure 6B:
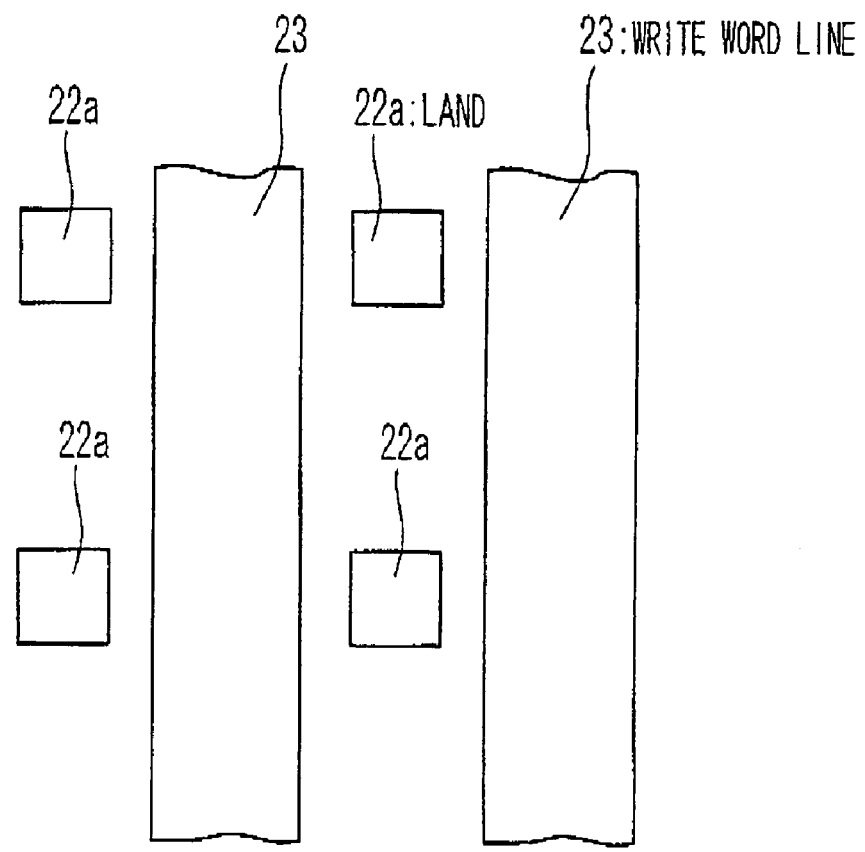
FIG. 6B is a plan view showing the manufacturing step of the magnetic memory shown in FIG. 5A to FIG. 5C.

FIGS. 6A to 6I are conceptual diagrams showing a preferred manufacturing method of the magnetic memory cell 10C. As shown in FIG. 6A, the write word line 23, the land 22a and the via-contact 22c are formed inside the interlayer insulating layer 20 that covers the substrate (not shown). The interlayer insulating layer 20 is made of $SiO_2$. As shown in FIG. 6B, the land 22a is located between the write word lines 23.

Figure 6C:
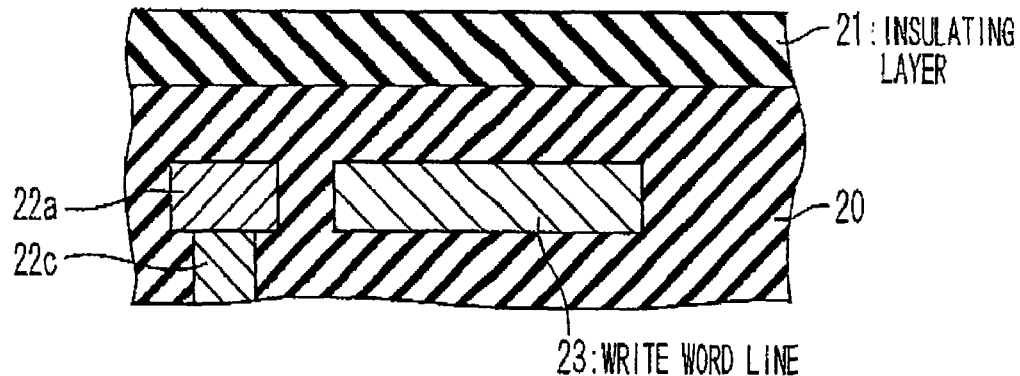
FIG. 6C is a sectional view showing the manufacturing step of the magnetic memory shown in FIG. 5A to FIG. 5C.
Figure 6D:
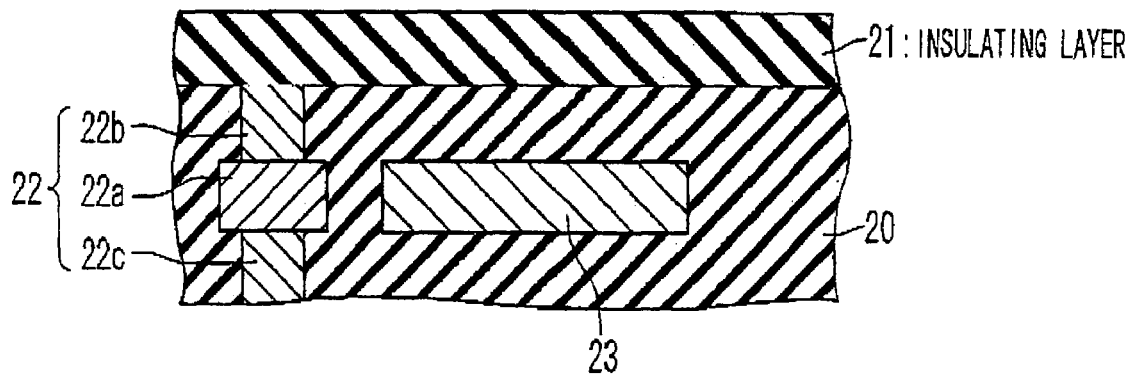
FIG. 6D is a sectional view showing the manufacturing step of the magnetic memory shown in FIG. 5A to FIG. 5C.

Subsequently, as shown in FIG. 6C, an insulting film 21 is formed on the interlayer insulating layer 20. The insulting film 21 is a layer that is processed to the stress inducing layer 19 through a later step. The insulting film 21 is formed such that the tensile thermal stress is induced therein. Specifically, the insulting film 21 such as a nitride film and boride film is made of a material, which is greater in thermal expansion coefficient than $SiO_2$ and hard, while the substrate is heated. The film formation temperature of the insulting film 21 is typically between 350 and 400° C. Moreover, as shown in FIG. 6D, the via-contact 22b is formed to penetrate the insulting film 21.

The insulting film 21 whose inner stress is in the tensile direction can be formed by using not the thermal stress but an intrinsic inner stress. In this case, even an $SiO_2$ film made of the same material as the interlayer insulating layer 20 can be formed by changing the film forming condition. Specifically, when a sputter method is used, the insulting film 21 whose the inner stress is in the tensile direction can be formed through increasing an argon gas pressure for sputtering and decreasing electric power to be used. When a plasma CVD method is used, the insulting film 21 whose inner stress is in the tensile direction can be formed through increasing an oxygen flow ratio of a source gas or changing the electric power to be used or the bias electric power of the substrate. Even under the same material, the stress inducing layers whose film forming conditions are different are different in morphology.

Figure 6E:
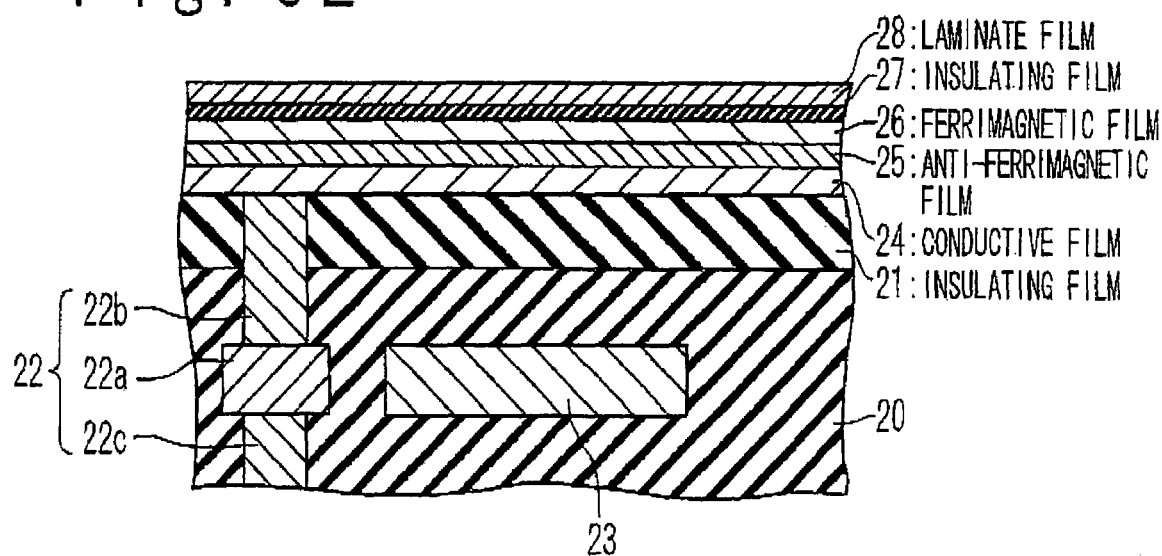
FIG. 6E is a sectional view showing the manufacturing step of the magnetic memory shown in FIG. 5A to FIG. 5C.

Subsequently, as shown in FIG. 6E, an conductive film 24, an anti-ferromagnetic film 25, a ferromagnetic film 26, an extremely thin insulting film 27 and a laminate film 28 composed of a plurality of ferromagnetic films that are separated from each other by non-magnetic layers are sequentially formed. As described later, the conductive film 24, the anti-ferromagnetic film 25, the ferromagnetic film 26, the insulting film 27 and the laminate film 28 are films, which are processed to the lower electrode layer 14, the anti-ferromagnetic layer 15, the magnetization pinned layer 16, the tunnel insulating layer 17 and the magnetization free layer 11C, respectively, by the processes that are subsequently performed.

Figure 6F:
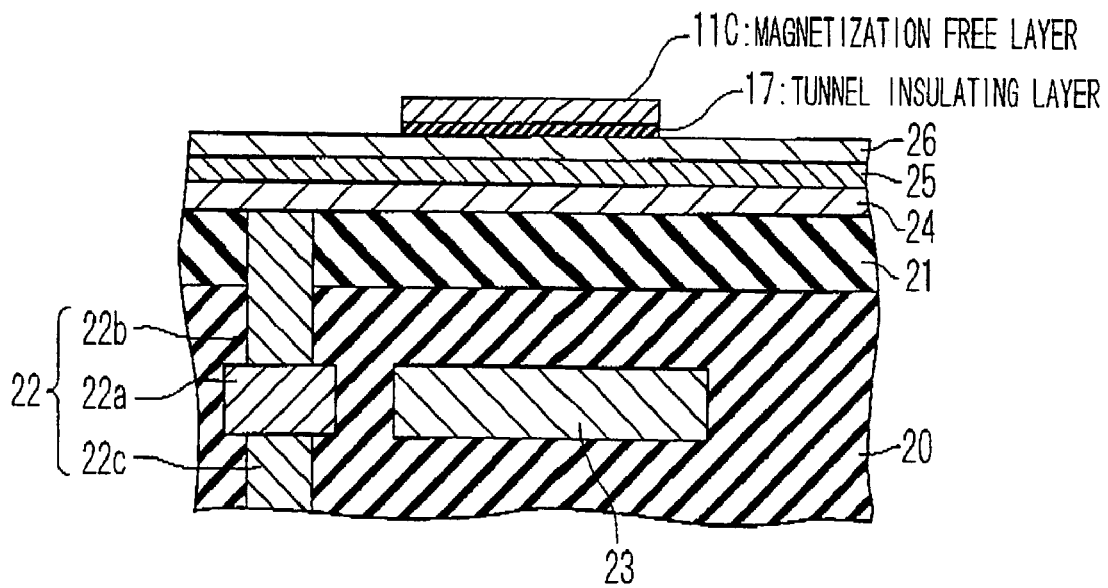
FIG. 6F is a sectional view showing the manufacturing step of the magnetic memory shown in FIG. 5A to FIG. 5C.

Subsequently, as shown in FIG. 6F, the insulting film 27 and the laminate film 28 are patterned, to form the tunnel insulating layer 17 and the magnetization free layer 11C.

Figure 6G:
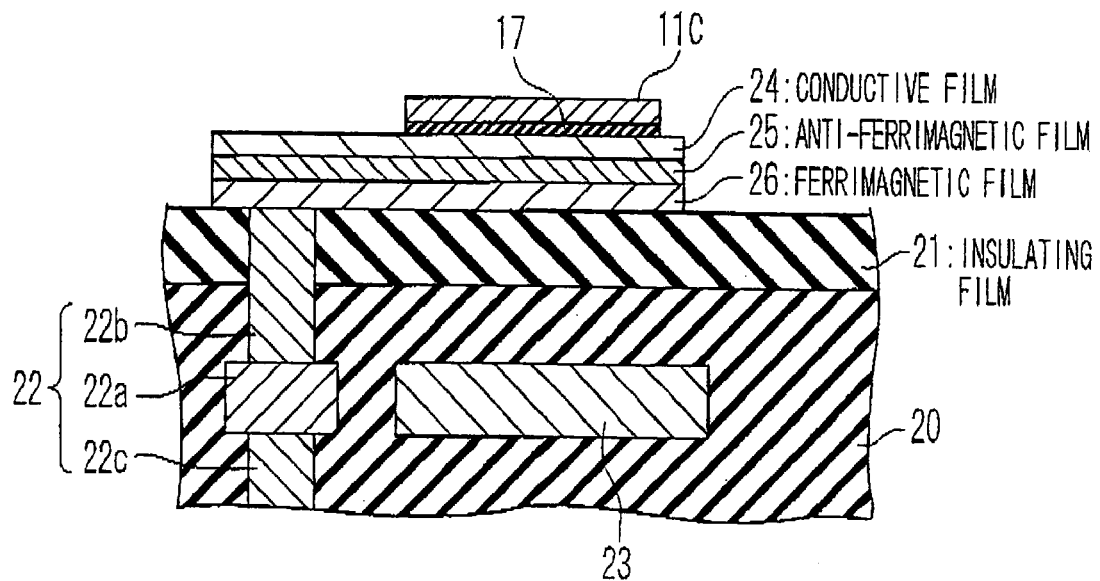
FIG. 6G is a sectional view showing the manufacturing step of the magnetic memory shown in FIG. 5A to FIG. 5C.
Figure 6H:
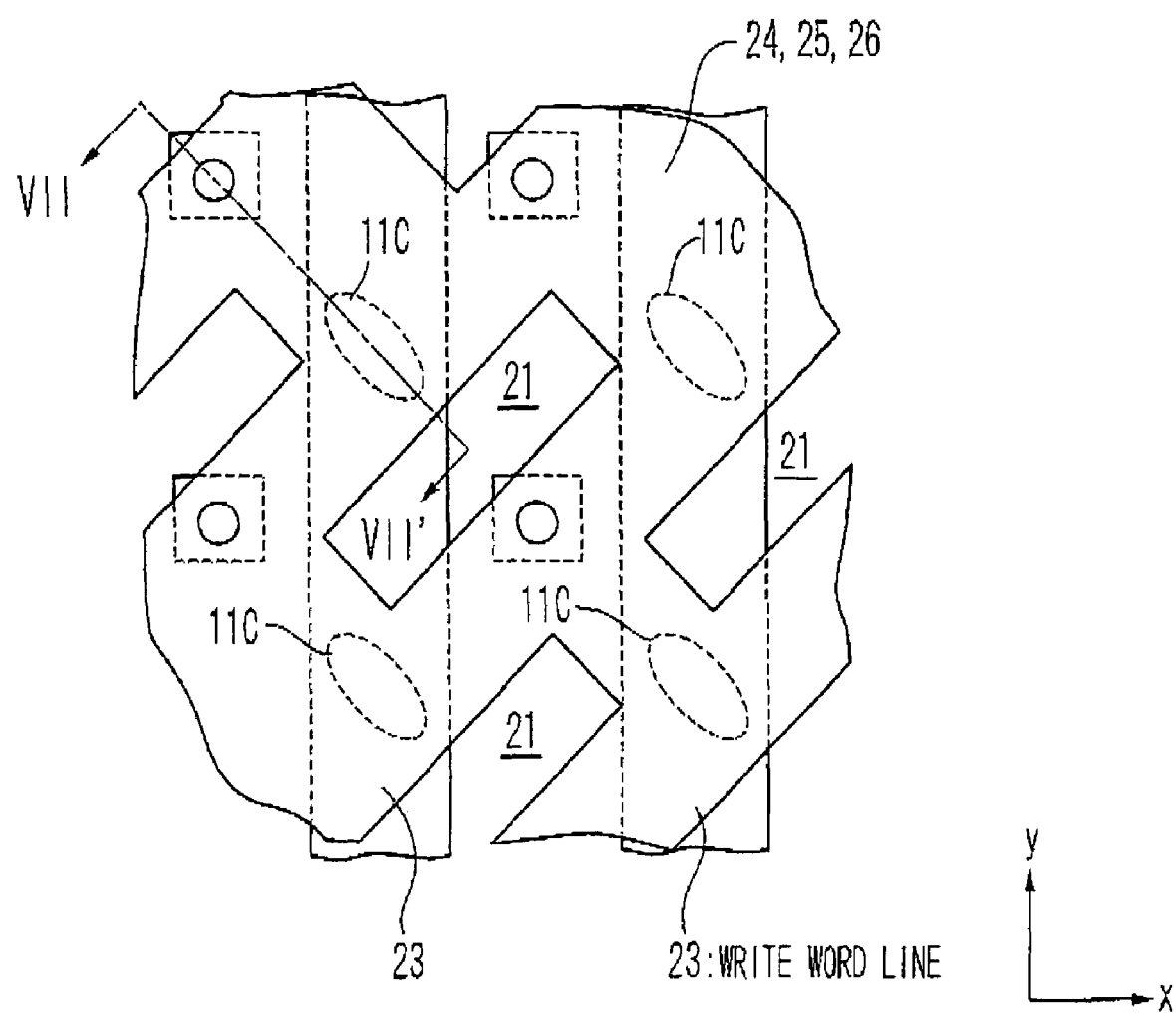
FIG. 6H is a plan view showing the manufacturing step of the magnetic memory shown in FIG. 5A to FIG. 5C.
Figure 61:
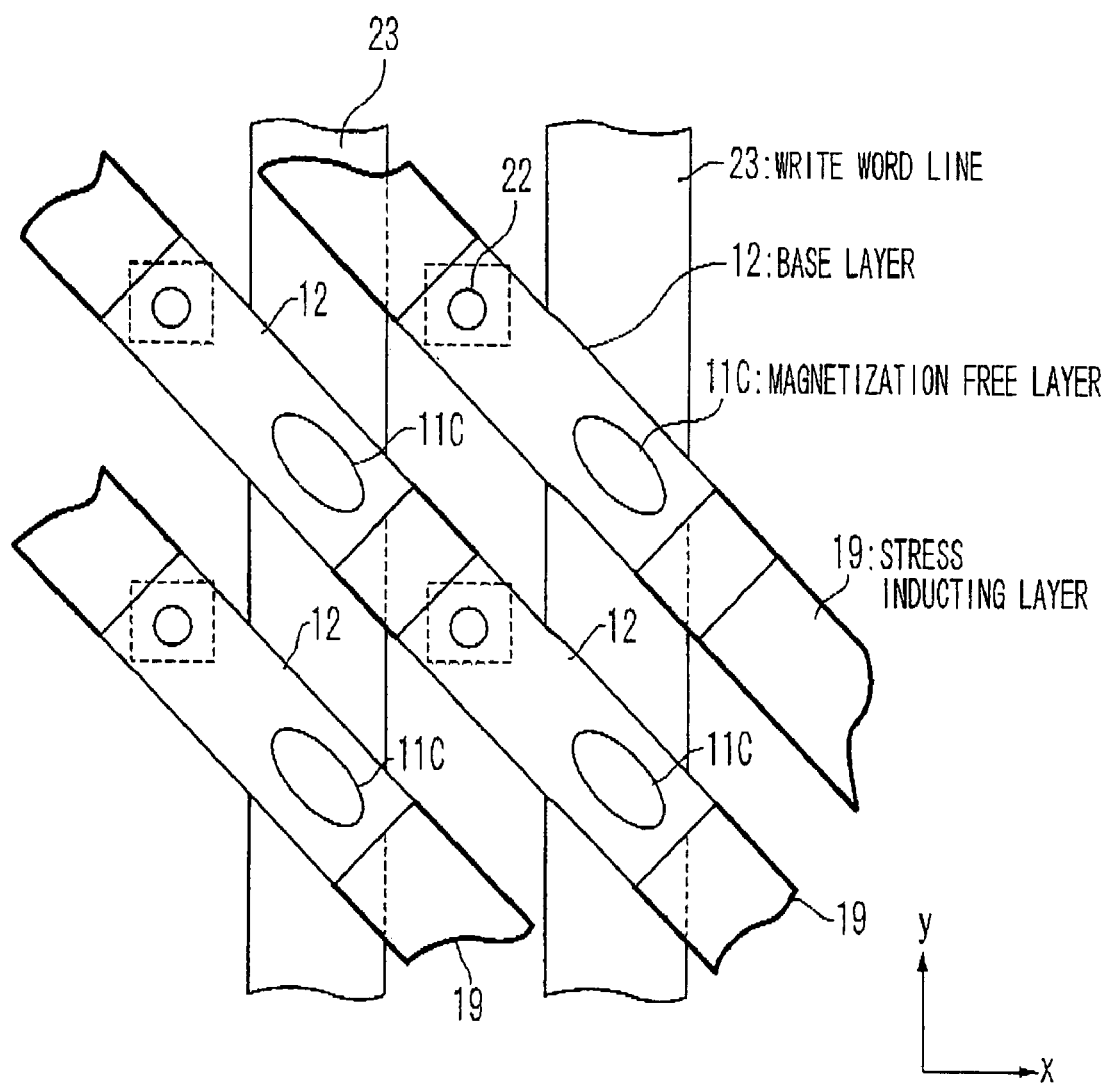

Subsequently, as shown in FIG. 6G, the conductive film 24, the anti-ferromagnetic film 25 and the ferromagnetic film 26 are patterned, to expose a part of the insulting film 21. However, as shown in FIG. 6H, in this patterning, all edges of the base layer 12 are not formed, and only the edge in a direction orthogonal to the longitudinal direction of the magnetization free layer 11C is formed.

Subsequently, as shown in FIG. 6I, the conductive film 24, the anti-ferromagnetic film 25, the ferromagnetic film 26 and the insulting film 21 are sequentially etched, to form the edge in the same direction as the longitudinal direction of the magnetization free layer 11C of the base layer 12 and the edge of the stress inducing layer 19. In this etching, the processes of the base layer 12 and the stress inducing layer 19 have been completed.

Subsequently, after the base layer 12 and the magnetization free layer 11C are covered with the interlayer insulating film 31, the via-contact 22b and the bit line 13 are formed, to complete the formation of the magnetic memory cell 10C shown in FIGS. 5A to 5C.

Figure 6J:
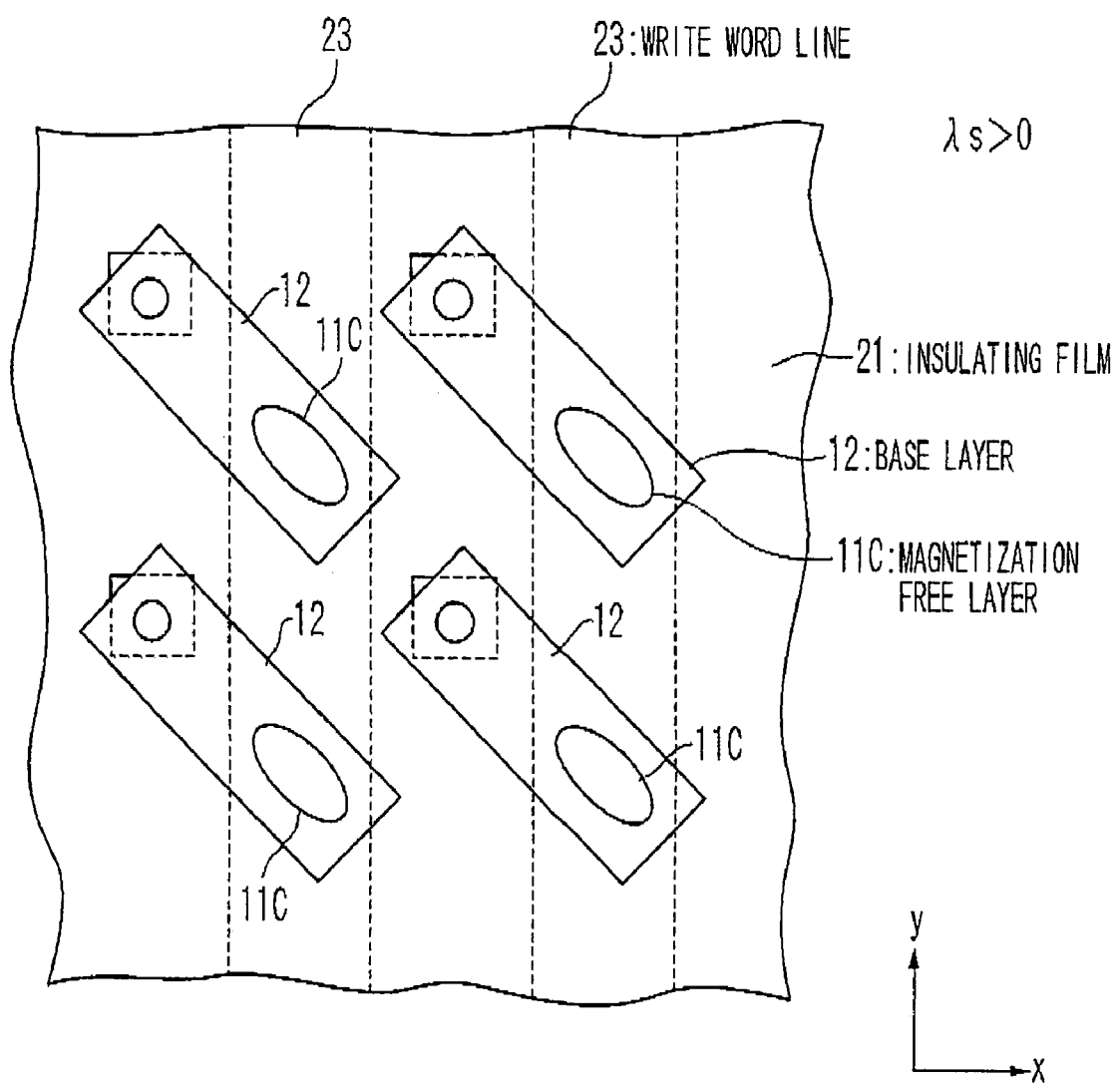
FIG. 6J is a plan view showing a variation example of the manufacturing step of the magnetic memory shown in FIG. 5A to FIG. 5C.

The base layer 12 and the stress inducing layer 19 can be patterned through the steps different from each other. In this case, the step of patterning the conductive film 24, the anti-ferromagnetic film 25 and the ferromagnetic film 26, which are shown in FIG. 6G, forms all of the edges of the base layer 12 (refer to FIG. 6J). Moreover, the insulting film 21 is patterned and the edge of the stress inducing layer 19 is formed.

Figure 7:
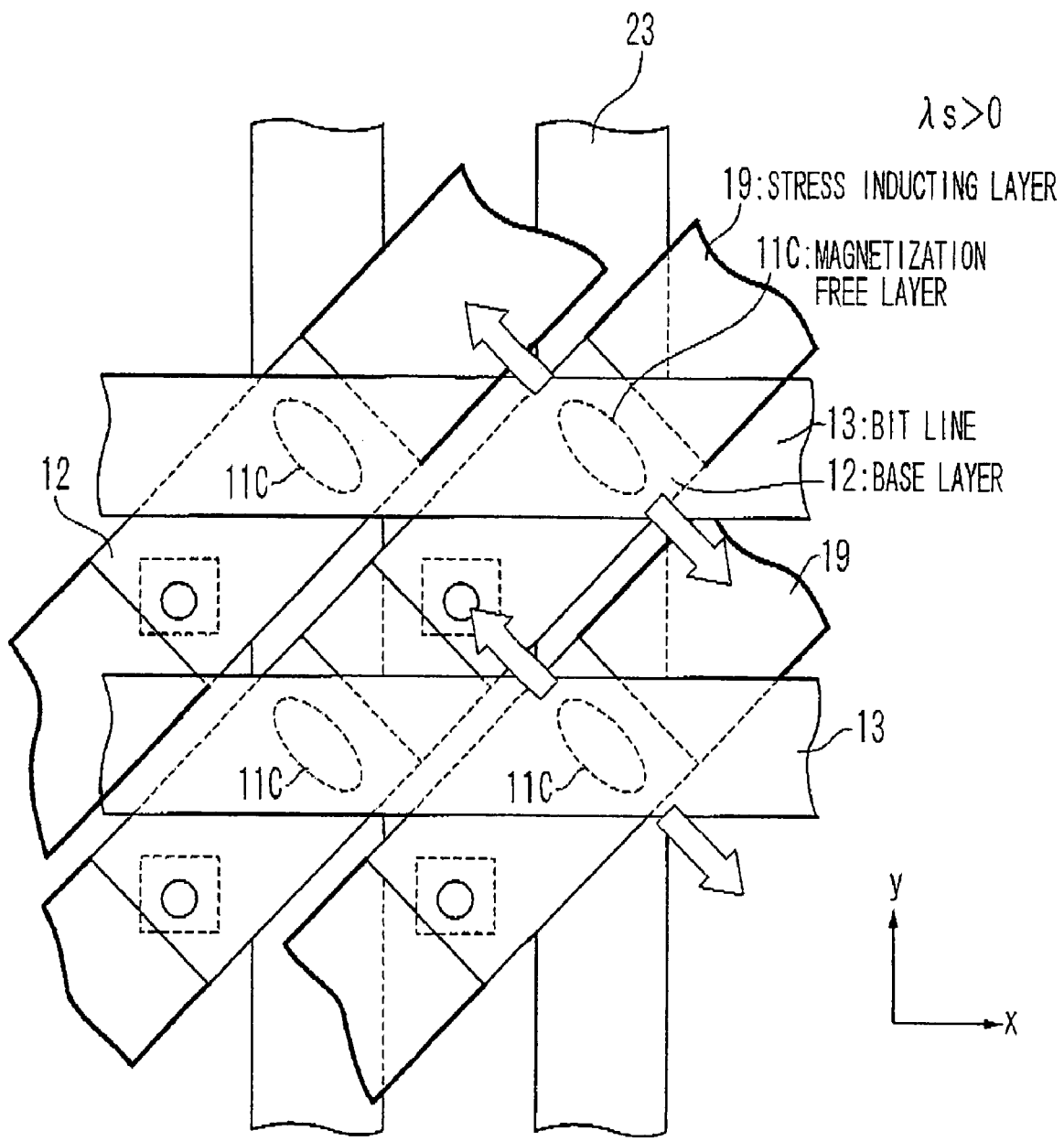
FIG. 7 is a plan view showing a ninth structure of the magnetic memory according to the first embodiment of the present invention.

The stress inducing layer 19 can be formed such that its inner stress is compression stress. In this case, as shown in FIG. 7, the stress inducing layer 19 is formed in a shape long in a direction orthogonal to the longitudinal direction of the magnetization free layer 11. Thus, the tensile stress is applied to the longitudinal direction of the magnetization free layer 11 whose magnetic strain constant $\lambda s$ is positive, and the direction of the stress inducing magnetic anisotropy is adjusted to a direction close to the direction of the shape magnetic anisotropy.

Figure 8A:
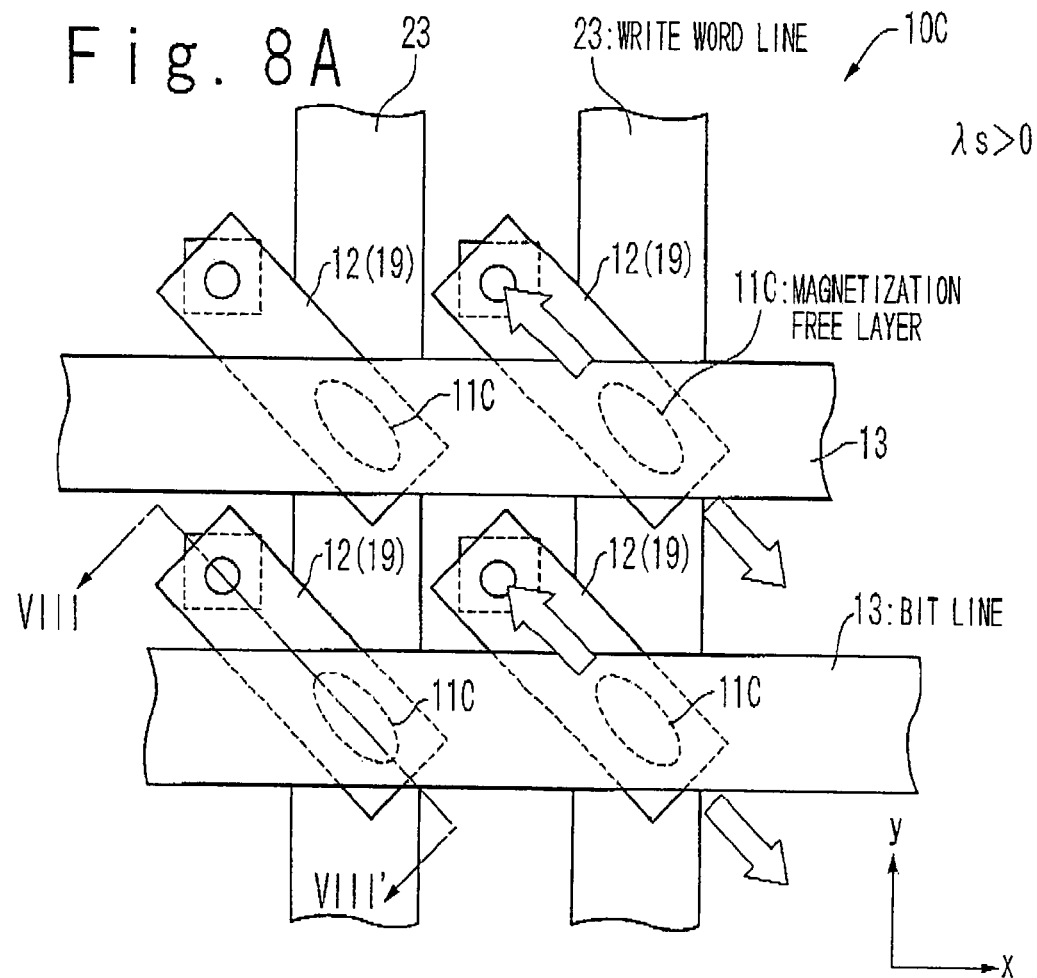
FIG. 8A is a plan view showing a tenth structure of the magnetic memory according to the first embodiment of the present invention.
Figure 8B:
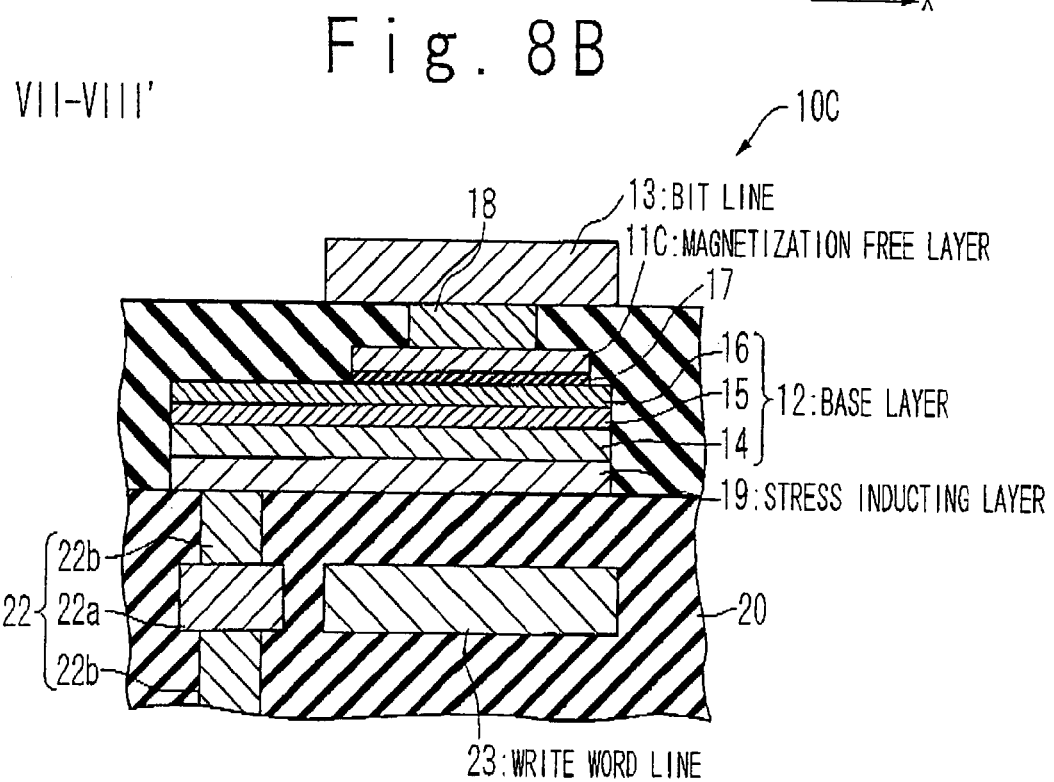
FIG. 8B is a sectional view showing the tenth structure of the magnetic memory according to the first embodiment of the present invention.

The stress inducing layer 19 can be also made of an electrical conductive material. In this case, as shown in FIGS. 8A and 8B, one single stress inducing layer 19 is formed for each base layer 12. Consequently, the adjacent base layer 12 is electrically separated.

Figure 9A:
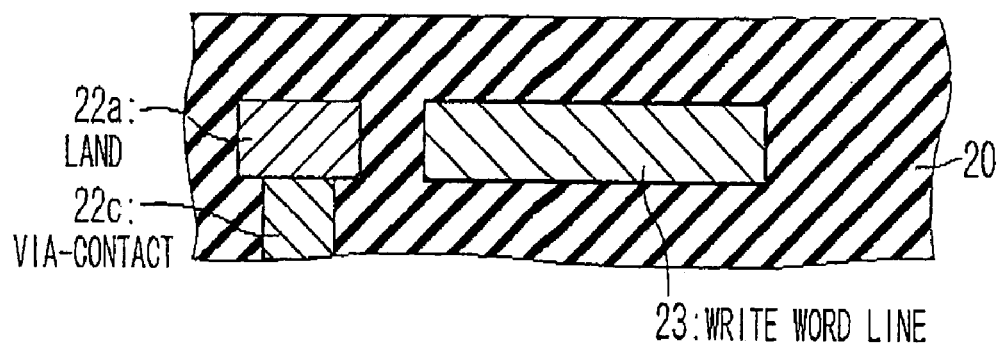
FIG. 9A is a sectional view showing a manufacturing step of the magnetic memory shown in FIG. 8A and FIG. 8B.
Figure 9B:
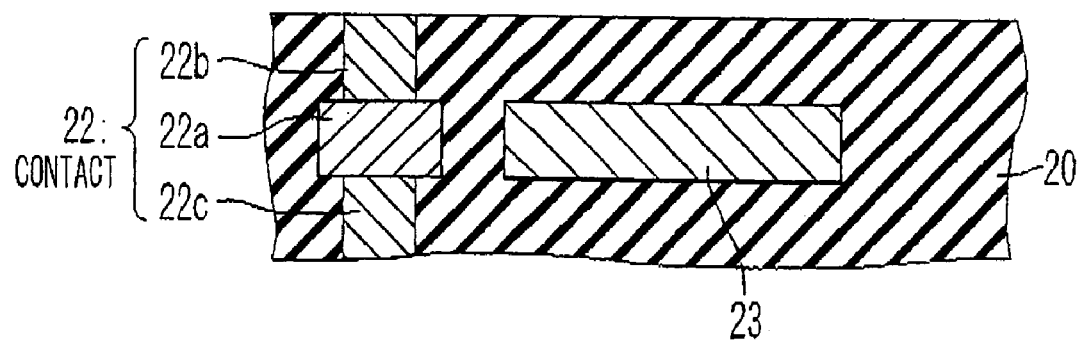
FIG. 9B is a sectional view showing the manufacturing step of the magnetic memory shown in FIG. 8A and FIG. 8B.

The magnetic memory cell 10C in FIGS. 8A and 8B is preferably produced through steps shown in FIGS. 9A to 9F. At first, as shown in FIG. 9A, the write word line 23, the land 22a and the via-contact 22c are formed inside the interlayer insulating layer 20 for covering a substrate (not shown). The interlayer insulating layer 20 is made of $SiO_2$. Subsequently, as shown in FIG. 9B, the via-contact 22b is formed that reaches from the surface of the interlayer insulating layer 20 to the land 22a.

Figure 9C:
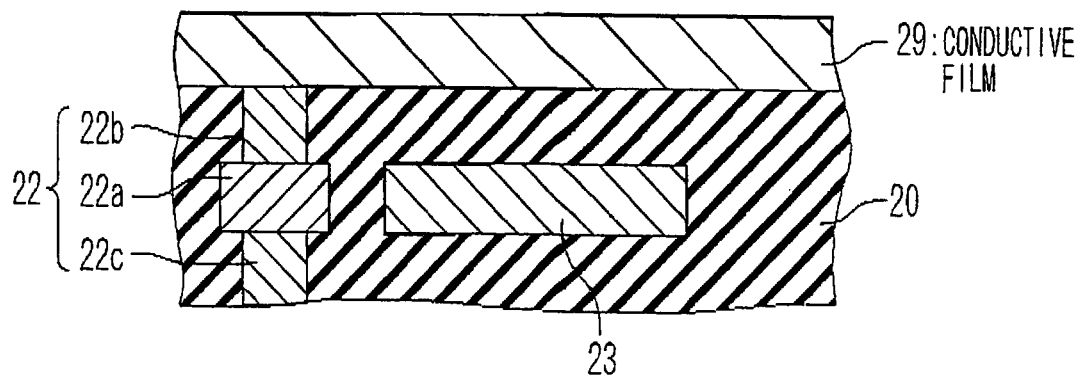
FIG. 9C is a sectional view showing the manufacturing step of the magnetic memory shown in FIG. 8A and FIG. 8B.
Figure 9D:
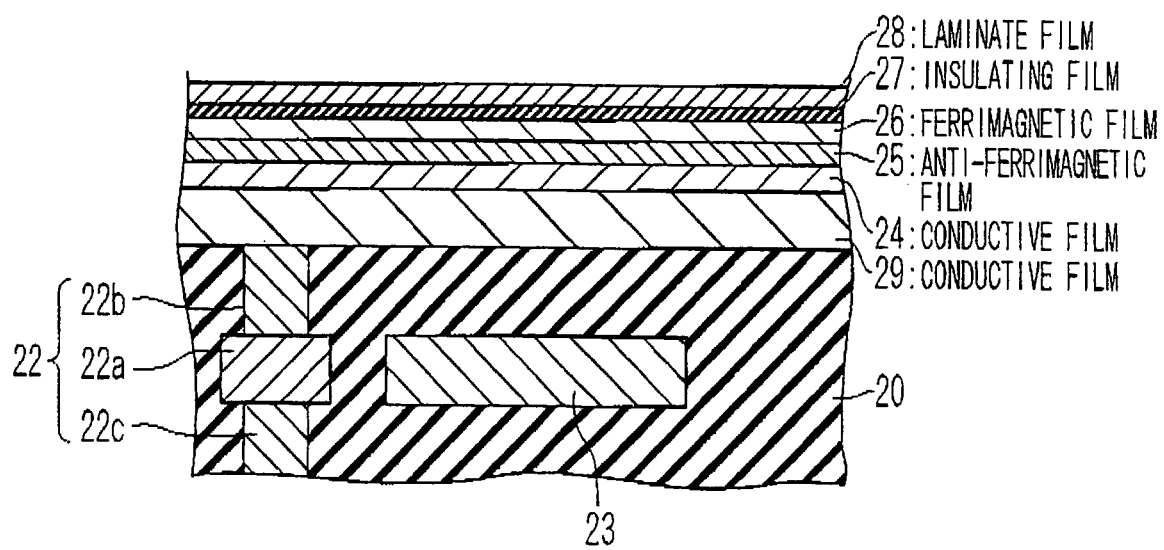
FIG. 9D is a sectional view showing the manufacturing step of the magnetic memory shown in FIG. 8A and FIG. 8B.
Figure 9E:
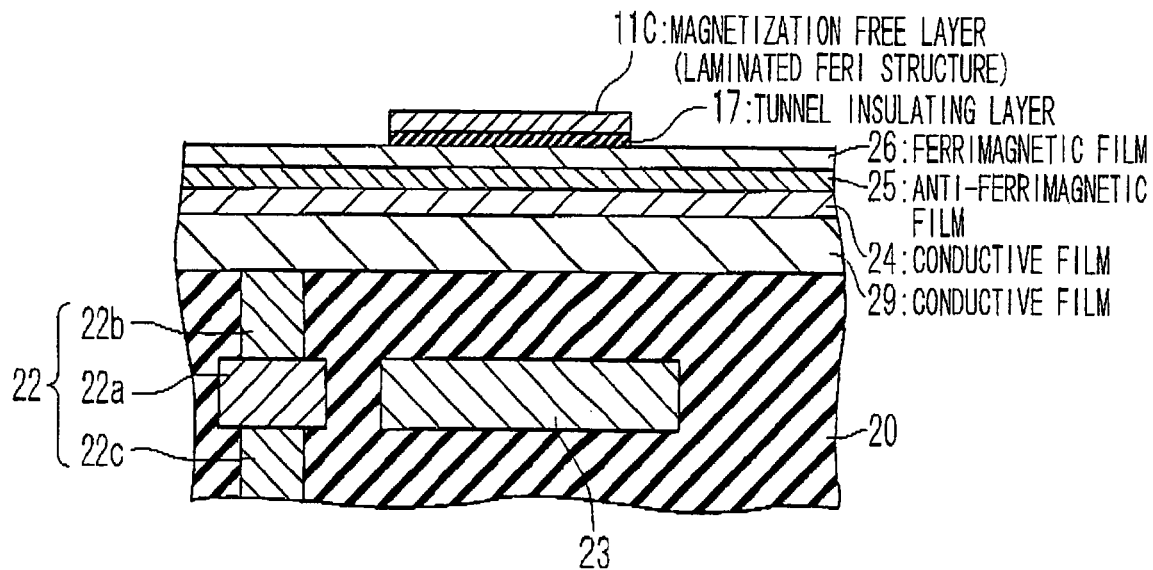
FIG. 9E is a sectional view showing the manufacturing step of the magnetic memory shown in FIG. 8A and FIG. 8B.

Subsequently, as shown in FIG. 9C, the upper surface of the interlayer insulating layer 20 is covered with a conductive film 29. The conductive film 29 is a film to be processed to the stress inducing layer 19 through the subsequent steps. Moreover, as shown in FIG. 9D, the conductive film 24, the anti-ferromagnetic film 25, the ferromagnetic film 26, the extremely thin insulating film 27, and the laminate film 28 composed of the plurality of ferromagnetic films that are separated from each other by non-magnetic layers are sequentially formed on the conductive film 29. Moreover, as shown in FIG. 9E, the insulting film 27 and the laminate film 28 are patterned, and the tunnel insulating layer 17 and the magnetization free layer 11C are formed.

Figure 9F:
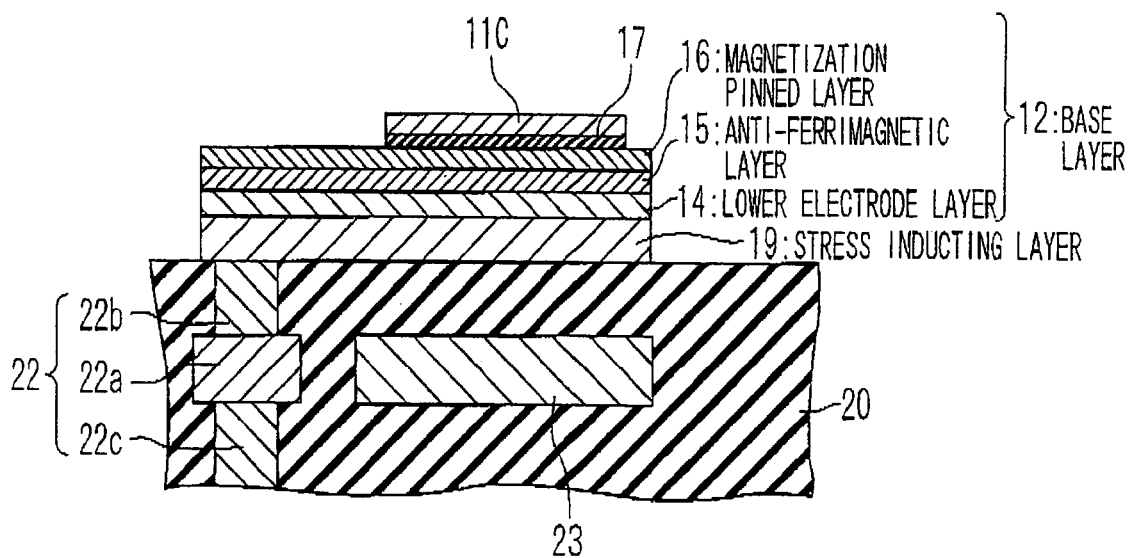
FIG. 9F is a sectional view showing the manufacturing step of the magnetic memory shown in FIG. 8A and FIG. 8B.

Subsequently, as shown in FIG. 9F, the conductive film 29, the conductive film 24, the anti-ferromagnetic film 25 and the ferromagnetic film 26 are patterned, to form the stress inducing layers 19 and the base layers 12. As mentioned above, one of the stress inducing layers 19 is formed on each of the base layers 12. Subsequently, after the base layer 12 and the magnetization free layer 11C are covered with the interlayer insulating film 31, the via-contact 22b and the bit line 13 are formed, thereby completing the formation of the magnetic memory cell 10C shown in FIGS. 8A and 8B.

SECOND EMBODIMENT

The base layer serving as a lower layer for the magnetization free layer and the tunnel insulating layer can be used as the stress inducing structure for applying the stress to the magnetization free layer, through suitable selection of its inner stress and shape. The discussion with regard to the inner stress and shape of the stress inducing layer and the direction of the stress applied to the magnetization free layer can be applied to the base layer as it is. For example, when the base layer is formed such that its inner stress is compression stress and its shape is long in the y-axis direction, the tensile stress can be applied to the magnetization free layer in the x-axis direction. The second embodiment provides the structure of the magnetic memory in which the base layer is used as the stress inducing structure.

Figure 10A:
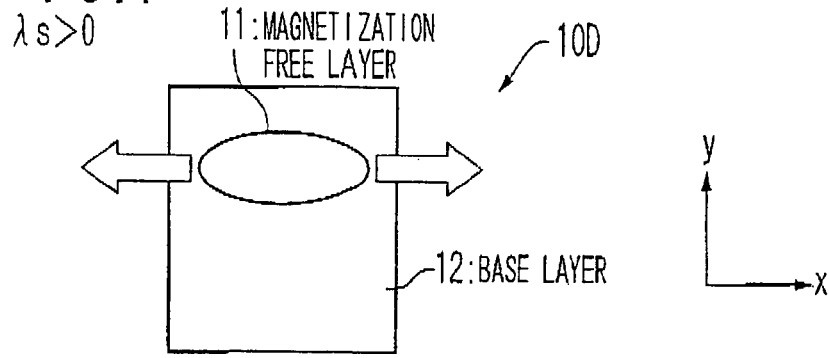
FIG. 10A is a plan view showing a first structure of a magnetic memory according to a second embodiment of the present invention.
Figure 10B:
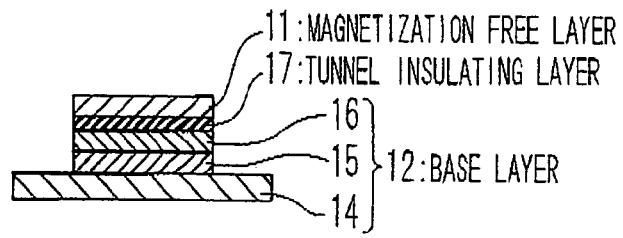
FIG. 10B is a sectional view showing the first structure of the magnetic memory according to the second embodiment of the present invention.

FIG. 10A is a plan view showing an example of the structure of a memory cell 10D of the magnetic memory according to the second embodiment, and FIG. 10B is a sectional view of the magnetic memory cell 10D. The magnetic memory cell 10D includes the magnetization free layer 11 and the base layer 12. The magnetization free layer 11 has a shape long in the x-axis direction, and its shape magnetic anisotropy is parallel to the x-axis direction. As shown in FIG. 10B, the base layer 12 includes the lower electrode layer 14, the anti-ferromagnetic layer 15 and the magnetization pinned layer 16. The magnetization pinned layer 16 is coupled through the tunnel insulating layer 17 to the magnetization free layer 11.

Figure 10C:
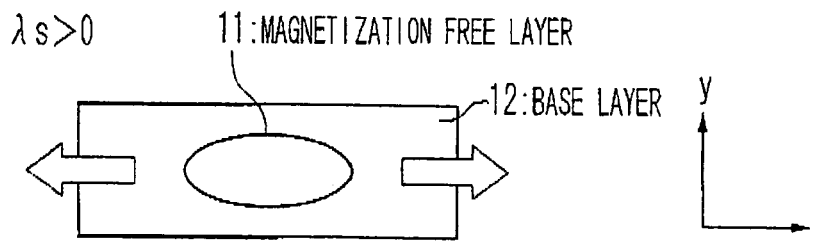
FIG. 10C is a plan view showing the second structure of the magnetic memory according to the second embodiment of the present invention.

Referring to FIG. 10A again, in this embodiment, in order to make the directions of the stress inducing magnetic anisotropy and shape magnetic anisotropy of the magnetization free layer 11 coincident, the polarity of the inner stress of the base layer 12 and the shape of the base layer 12 are suitably selected. Specifically, when the magnetic strain constant λs of the magnetization free layer 11 is positive, the base layer 12 is formed such that its inner stress is compression stress and its shape is long in the y-axis direction. Consequently, since the tensile stress is applied to the magnetization free layer 11 in the x-axis direction, the stress inducing magnetic anisotropy of the magnetization free layer 11 is oriented in the same x-axis direction as the direction of the shape magnetic anisotropy. Instead, the base layer 12 may be formed such that its inner stress is the tensile stress and its shape is long in the x-axis direction (refer to FIG. 10C). Even under the arrangement shown in FIG. 10C, the stress inducing magnetic anisotropy of the magnetization free layer 11 can be oriented to the same x-axis direction as the direction of the shape magnetic anisotropy.

Figure 10D:
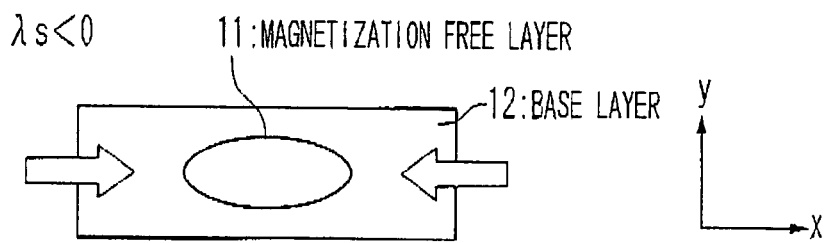
FIG. 10D is a plan view showing the third structure of the magnetic memory according to the second embodiment of the present invention.
Figure 10E:
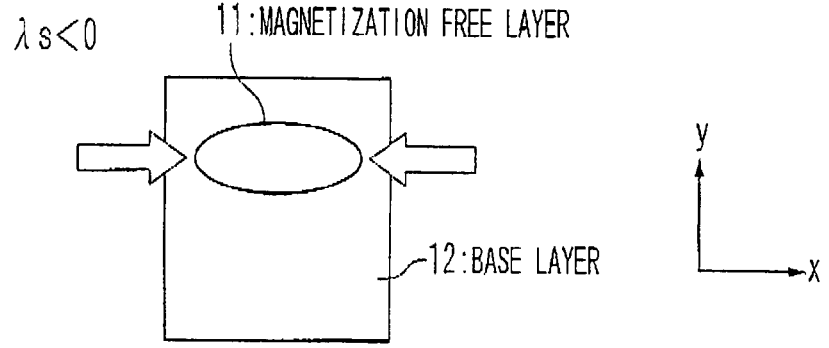
FIG. 10E is a plan view showing the third structure of the magnetic memory according to the second embodiment of the present invention.

On the other hand, when the magnetic strain constant λs of the magnetization free layer 11 is negative, the base layer 12 is formed such that its inner stress is the tensile stress and its shape is long in the x-axis direction, as shown in FIG. 10D. Consequently, since the compression stress is applied to the magnetization free layer 11 in the x-axis direction, the stress inducing magnetic anisotropy of the magnetization free layer 11 is oriented to the same x-axis direction as the direction of the shape magnetic anisotropy. Instead, the base layer 12 may be formed such that its inner stress is the compression stress and its shape is long in the y-axis direction (refer to FIG. 10E). Even under the arrangement shown in FIG. 10E, the stress inducing magnetic anisotropy of the magnetization free layer 11 can be oriented to the same x-axis direction as the direction of the shape magnetic anisotropy.

The effectiveness of the technique for controlling the direction of the stress inducing magnetic anisotropy on the basis of the inner stress and shape of the base layer 12 and the polarity of the magnetic strain constant λs of the magnetization free layer 11 was verified through an experiment by the inventor. In the experiment, the MR curve (Magnetic field-Resistance curve) were measured of MTJ (refer to FIG. 11A) including the magnetization free layer in which the directions of the shape magnetic anisotropy (Kshape) and the stress inducing magnetic anisotropy (Kstress) are parallel and MTJ (refer to FIG. 11B) including the magnetization free layer in which the directions of the shape magnetic anisotropy and the stress inducing magnetic anisotropy are orthogonal. The structure of the magnetization free layer 11 and an Al wiring 30 formed below it are same between both MTJs shown in FIGS. 11A and 11B. The magnetization free layer 11 was formed such that its shape was long in the x-axis direction and its magnetic strain constant λs was $4 \times 10^{-6}$. The shape magnetic anisotropy of the magnetization free layer 11 was oriented to the x-axis direction. The Al wiring 30 was arranged to extend in the x-axis direction. On the other hand, the structure of the base layer 12 was different between FIGS. 11A and 11B. In case of MTJ of FIG. 11A, the base layer 12 was formed such that its inner stress was the compression stress and its shape was long in the y-axis direction. Specifically, the base layer 12 of FIG. 11A was formed such that the width of the x-axis direction was 2 μm and the length of the y-axis direction was 2.5 μm. Consequently, in case of MTJ in FIG. 11A, since the tensile stress was applied to the magnetization free layer 11 in the x-axis direction, the stress inducing magnetic anisotropy of the magnetization free layer 11 was oriented to the same x-axis direction as the direction of the shape magnetic anisotropy. On the other hand, in case of MTJ of FIG. 11B, the base layer 12 was formed such that its inner stress was the compression stress and its shape was long in the x-axis direction. Specifically, the base layer 12 of the FIG. 11B was formed such that the length of the x-axis direction was 2.8 μm and the width of the y-axis direction was 1.5 μm. Consequently, in case of MTJ of FIG. 11B, since the compression stress is applied to the magnetization free layer 11 in the x-axis direction, the stress inducing magnetic anisotropy of the magnetization free layer 11 is oriented to the y-axis direction orthogonal to the direction of the shape magnetic anisotropy.

Figure 11A:
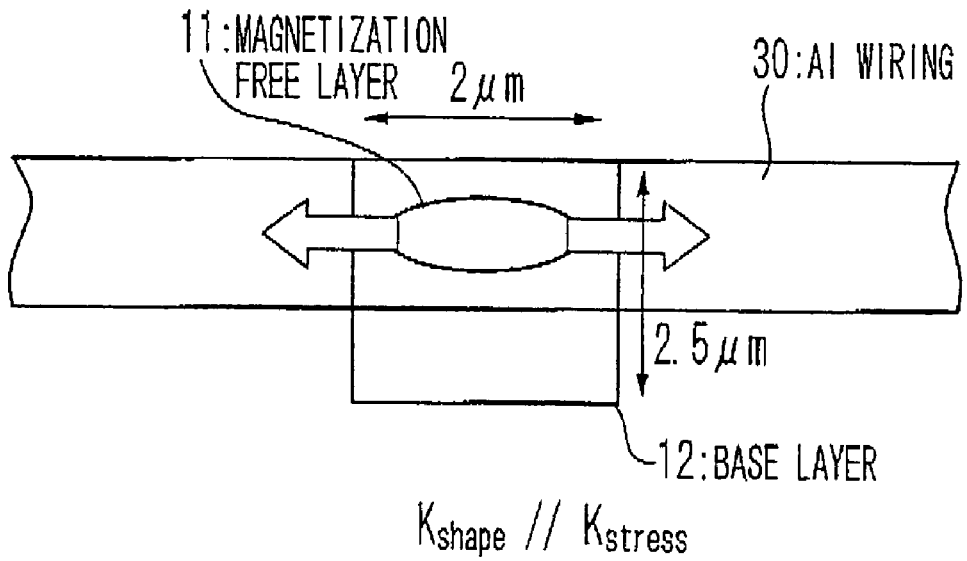
FIG. 11A is a plan view showing a structure of a sample which is controlled such that a shape magnetic anisotropy and a stress inducing magnetic anisotropy are made parallel, depending on a shape of a base layer.
Figure 11B:
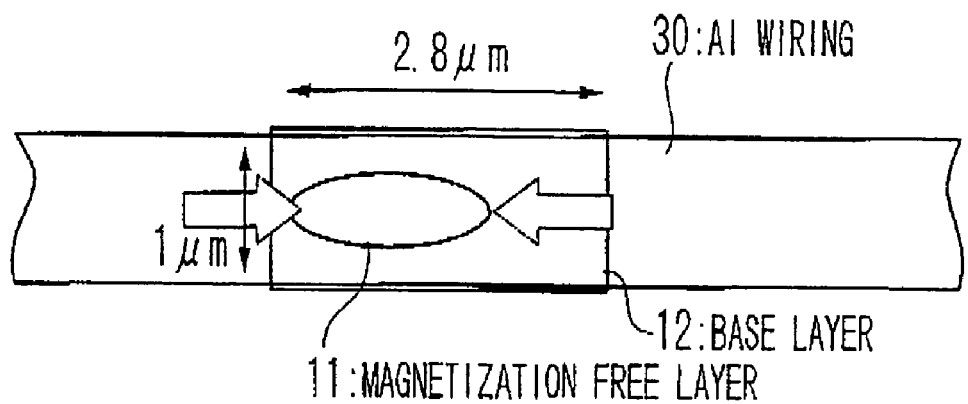
FIG. 11B is a plan view showing a structure of a sample which is controlled such that the shape magnetic anisotropy and the stress inducing magnetic anisotropy are made vertical, depending on the shape of the base layer.
Figure 12A:
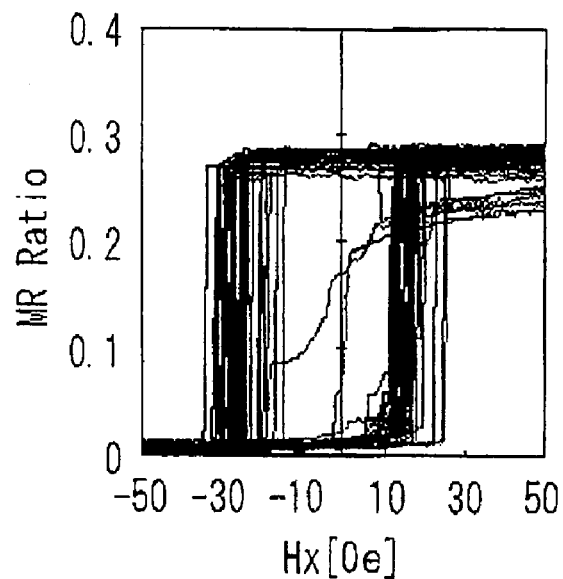
FIG. 12A is a graph showing an MR curve of the sample of FIG. 11A.
Figure 12B:
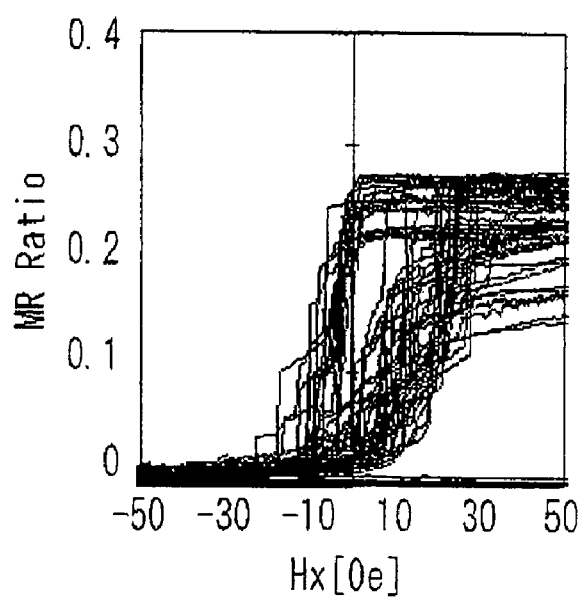
FIG. 12B is a graph showing an MR curve of the sample of FIG. 11B.

FIGS. 12A and 12B are the MR curve of the MTJ shown in FIG. 11A and the MR curve of the MTJ shown in FIG. 11B, respectively. As shown in FIG. 12B, in case of MTJ shown in FIG. 11B, in which the stress inducing magnetic anisotropy of the magnetization free layer 11 was orthogonal to the direction of the shape magnetic anisotropy, the pinning of a magnetic domain wall movement was remarkably generated, and variation in its switching field was great. Specifically, in case of MTJ shown in FIG. 11B, an average value of the switching fields was 14 (Oe), and the standard deviation of the switching fields was 50% of the average value. On the other hand, as shown in FIG. 12A, in case of MTJ shown in FIG. 11A, in which the stress inducing magnetic anisotropy of the magnetization free layer 11 was parallel to the shape magnetic anisotropy, the MR curve whose square deviation was excellent was generated, and the variation in its switching field was relatively small. Specifically, in case of MTJ shown in FIG. 11A, the average value of the switching fields was 21 (Oe), and the standard deviation of the switching fields was 21% of the average value. The graphs of FIGS. 12A and 12B show the effectiveness of the technique that controls the direction of the stress inducing magnetic anisotropy on the basis of the inner stress and shape of the base layer 12 and the polarity of the magnetic strain constant λs of the magnetization free layer 11.

Figure 13A:
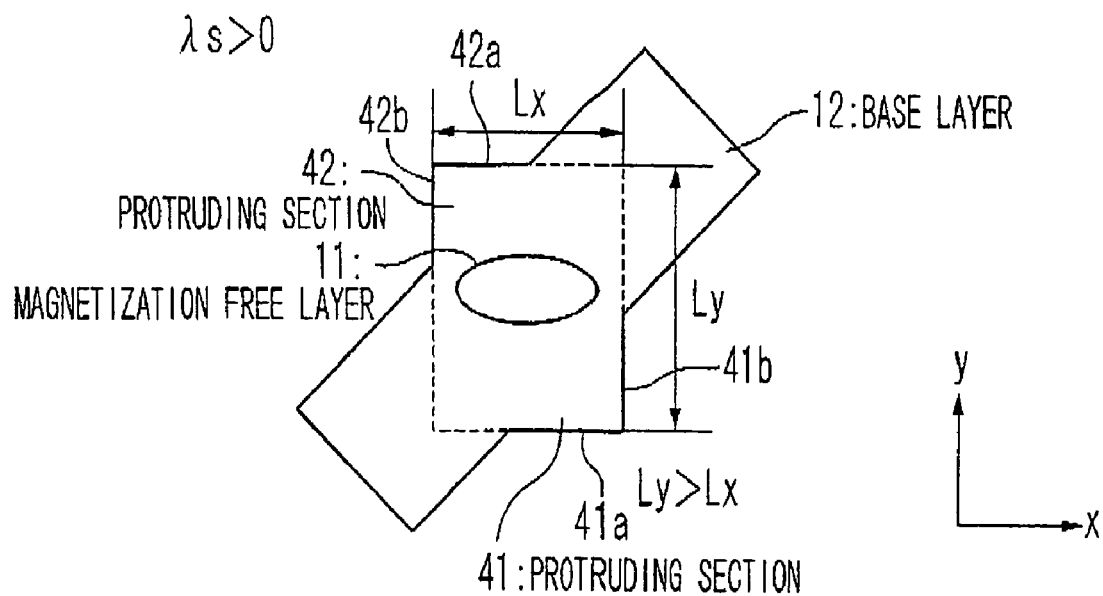
FIG. 13A is a plan view showing a fourth structure of the magnetic memory according to the second embodiment of the present invention.
Figure 13B:
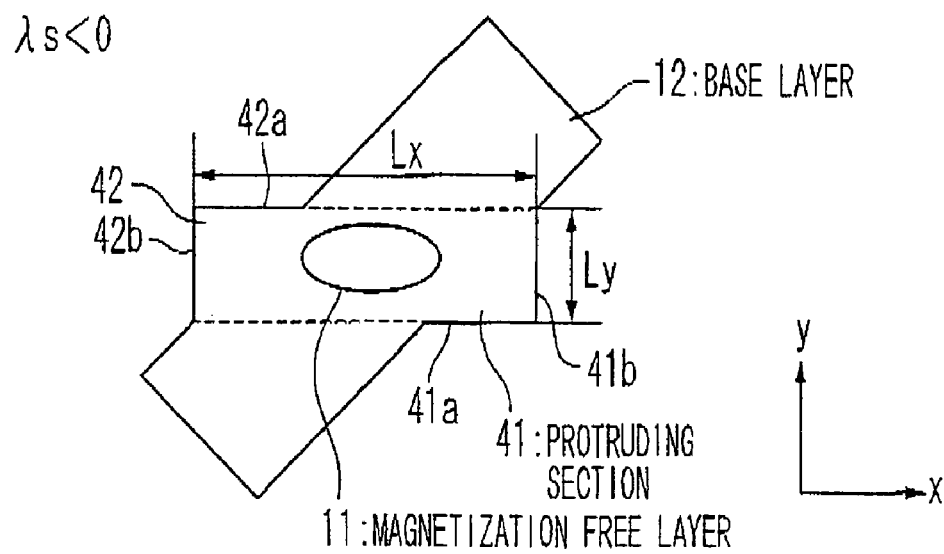
FIG. 13B is a plan view showing a fifth structure of the magnetic memory according to the second embodiment of the present invention.

As mentioned above, the base layer 12 is formed to extend obliquely into a direction of the shape magnetic anisotropy of the magnetization free layer 11 and this causes the direction of the stress inducing magnetic anisotropy to be oriented to a direction different from the direction of the shape magnetic anisotropy. However, even when the base layer 12 is formed to obliquely extend, it is possible to suitably control the direction of the stress inducing magnetic anisotropy through the optimization of the shape of the base layer 12. FIGS. 13A and 13B are plan views showing the preferable shape of the base layer 12 when the base layer 12 extends obliquely into the direction of the shape magnetic anisotropy of the magnetization free layer 11.

As shown in FIGS. 13A and 13B, when the base layer 12 is obliquely formed, protrusions 41 and 42 protruding in a direction orthogonal to the extension direction of the base layer 12 are preferably provided for the base layer 12. The protrusions 41 and 42 protrude to the directions opposite to each other. The protrusions 41 and 42 make it possible for the stress applied to the magnetization free layer 11 by the base layer 12 to be made close to the longitudinal direction of the magnetization free layer 11, or the direction orthogonal to the longitudinal direction, so that the direction of the stress inducing magnetic anisotropy is made close to the direction of the shape magnetic anisotropy.

In detail, the protrusion 41 has an edge 41a parallel to the x-axis direction and an edge 41b parallel to the y-axis direction, and the protrusion 42 has an edge 42a parallel to the x-axis direction and an edge 42b parallel to the y-axis direction. As shown in FIG. 13A, when the magnetic strain constant λs of the magnetization free layer 11 is positive and the inner stress of the base layer 12 is the compression stress, the protrusions 41 and 42 are formed such that an interval Ly between the edge 41a of the protrusion 41 and the edge 42a of the protrusion 42 in the y-axis direction is larger than an interval Lx between the edge 41b of the protrusion 41 and the edge 42b of the protrusion 42 in the x-axis direction. The protrusions 41 and 42 apply the tensile stress to the magnetization free layer 11 in a direction close to the x-axis direction. Since the protrusions 41 and 42 are formed in such shapes, the tensile stress in the direction close to the x-axis direction can be applied to the magnetization free layer 11, and the direction of the stress inducing magnetic anisotropy can be consequently made close to the direction of the shape magnetic anisotropy.

On the other hand, as shown in FIG. 13B, when the magnetic strain constant λs of the magnetization free layer 11 is negative and the inner stress of the base layer 12 is the compression stress, the protrusions 41 and 42 are formed in the shape in which the interval Ly between the edge 41a and the edge 42a in the y-axis direction is smaller than the interval Lx between the edge 41b and the edge 42b in the x-axis direction. Thus, the compression stress in the direction close to the x-axis direction is applied to the magnetization free layer 11 and consequently the direction of the stress inducing magnetic anisotropy can be made close to the direction of the shape magnetic anisotropy.

THIRD EMBODIMENT

Even the wiring located lower than the base layer (namely, the wiring located between the base layer and the substrate) can be used as the stress inducing structure to apply the stress to the magnetization free layer, by suitably selecting the extension direction. As mentioned above, according to the experiment by the inventor, the wiring arranged between the base layer and the substrate applies the tensile stress to the magnetization free layer in the same direction as the extension direction of the wiring and applies the compression stress to the magnetization free layer in the direction orthogonal to the extension direction of the wiring. Using such a phenomenon, the wiring located lower than the base layer can be used as the stress inducing structure. The third embodiment provides the structure of the magnetic memory in which the wiring located lower than the base layer is used as the stress inducing structure.

Figure 14A:
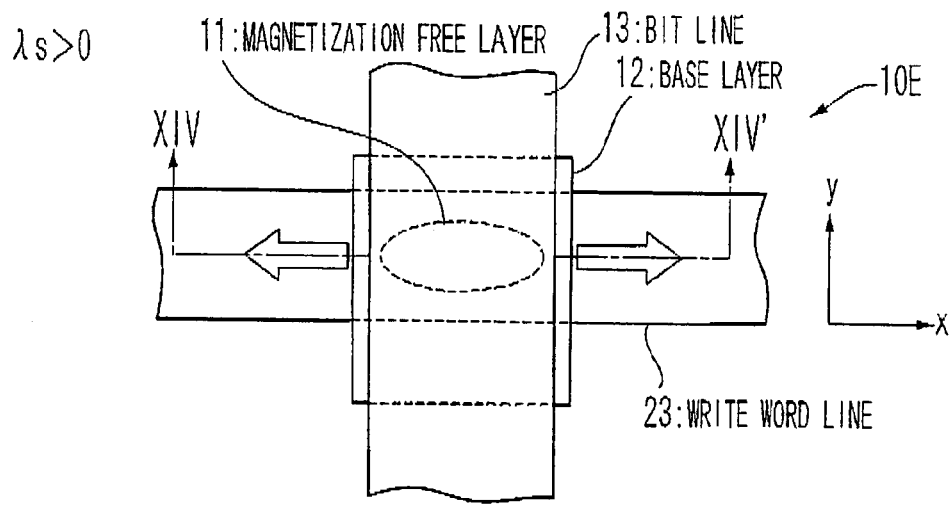
FIG. 14A is a plan view showing a first structure of a magnetic memory according to a third embodiment of the present invention.
Figure 14B:
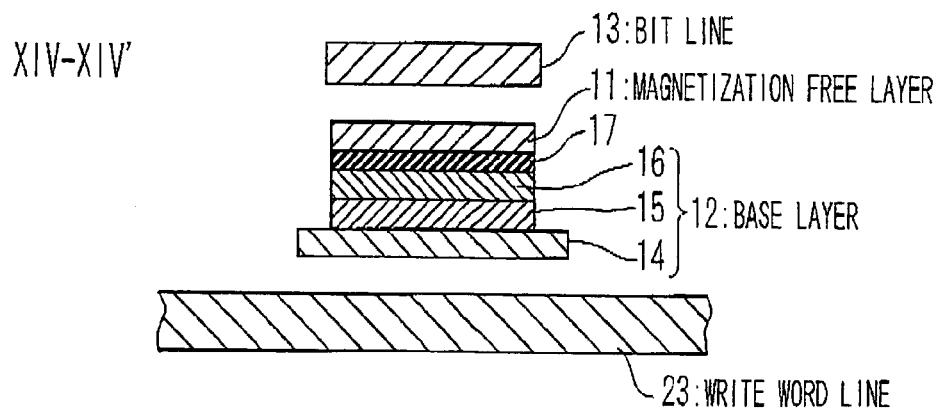
FIG. 14B is a sectional view showing the first structure of the magnetic memory according to the third embodiment of the present invention.

FIG. 14A is a plan view showing an example of the structure of a memory cell 10E of the magnetic memory according to the third embodiment, and FIG. 14B is a sectional view of the magnetic memory cell 10E. The magnetic memory cell 10E includes the bit line 13 and the write word line 23. The magnetization free layer 11 and the base layer 12 are provided at a position at which the write word line 23 and the write word line 23 intersect. The magnetization free layer 11 has a shape long in the x-axis direction, and its shape magnetic anisotropy is parallel to the x-axis direction. As shown in FIG. 14B, the base layer 12 includes the lower electrode layer 14, the anti-ferromagnetic layer 15 and the magnetization pinned layer 16. The magnetization pinned layer 16 is connected through the tunnel insulating layer 17 to the magnetization free layer 11.

Referring to FIG. 14A again, in this embodiment, in order to make the directions of the stress inducing magnetic anisotropy and shape magnetic anisotropy of the magnetization free layer 11 coincident, the extension direction of the write word line 23 is suitably selected. Specifically, when the magnetic strain constant λs of the magnetization free layer 11 is positive, the write word line 23 is formed to extend in the x-axis direction. Thus, the tensile stress is applied to the magnetization free layer 11 in the x-axis direction. Therefore, the stress inducing magnetic anisotropy of the magnetization free layer 11 is oriented to the same x-axis direction as the direction of the shape magnetic anisotropy.

Figure 14C:
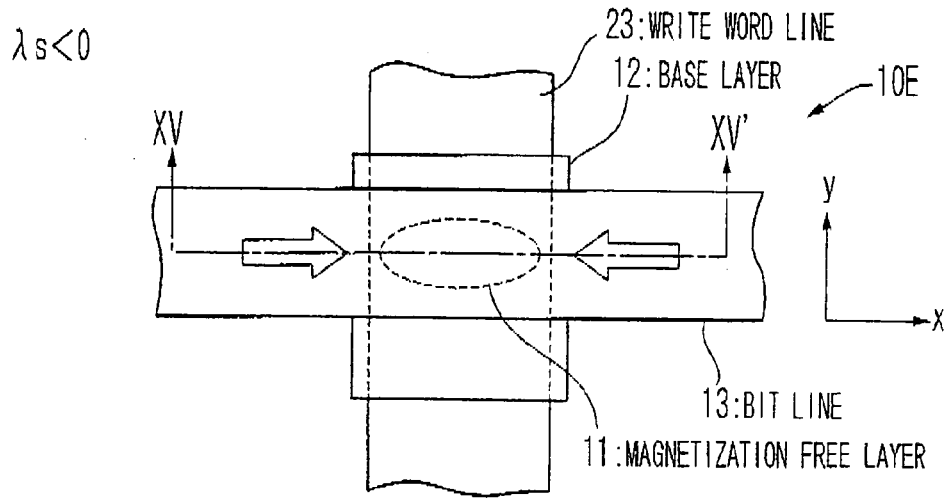
FIG. 14C is a sectional view showing a second structure of the magnetic memory according to the third embodiment of the present invention.

On the other hand, when the magnetic strain constant λs of the magnetization free layer 11 is negative, the write word line 23 is formed to extend in the y-axis direction, as shown in FIG. 14C. Thus, the compression stress is applied to the magnetization free layer 11 in the x-axis direction. Therefore, the stress inducing magnetic anisotropy of the magnetization free layer 11 is oriented to the same x-axis direction as the direction of the shape magnetic anisotropy.

The effectiveness of the technique for controlling the direction of the stress inducing magnetic anisotropy on the basis of the extension direction of the wiring located lower than the base layer; and the polarity of the magnetic strain constant λs of the magnetization free layer 11 was verified by an experiment by the inventor. In the experiment, the MR curves (Magnetic field-Resistance curve) were measured of MTJ (refer to FIG. ISA) including the magnetization free layer in which the directions of the shape magnetic anisotropy (K-shape) and the stress inducing magnetic anisotropy (Kstress) are parallel and MTJ (refer to FIG. 15B) including the magnetization free layer in which the directions of the shape magnetic anisotropy and the stress inducing magnetic anisotropy are orthogonal to each other. In case of MTJs shown in FIGS. 15A and 15B, the structure of the magnetization free layer 11 is same. The magnetization free layer 11 was formed such that its shape was long in the x-axis direction and its magnetic strain constant λs was $4\times10^{-6}$. The shape magnetic anisotropy of the magnetization free layer 11 was oriented to the x-axis direction. On the other hand, the extension direction of the write word line 23 was different between FIG. 15A and FIG. 15B. In the case of MTJ shown in FIG. 15A, the write word line 23 was formed to extend to the x-axis direction. Consequently, in the case of MTJ shown in FIG. 15A, since the tensile stress was applied to the magnetization free layer 11 in the x-axis direction, the stress inducing magnetic anisotropy of the magnetization free layer 11 was oriented to the same x-axis direction as the direction of the shape magnetic anisotropy. On the other hand, in the case of MTJ shown in FIG. 15B, the write word line 23 was formed to extend in the Y-axis direction. Consequently, in the case of MTJ shown in FIG. 15B, since the compression stress is applied to the magnetization free layer 11 in the x-axis direction, the stress inducing magnetic anisotropy of the magnetization free layer 11 is oriented to the y-axis direction orthogonal to the direction of the shape magnetic anisotropy.

Figure 15A:
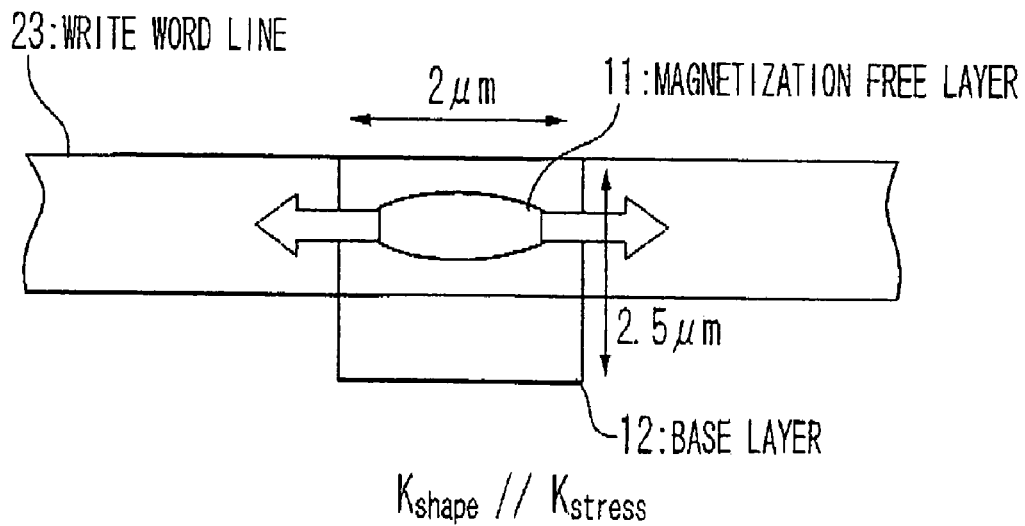
FIG. 15A is a plan view showing a structure of a sample which is controlled such that a shape magnetic anisotropy and a stress inducing magnetic anisotropy are made parallel, depending on an extending direction of a write word line 23.
Figure 15B:
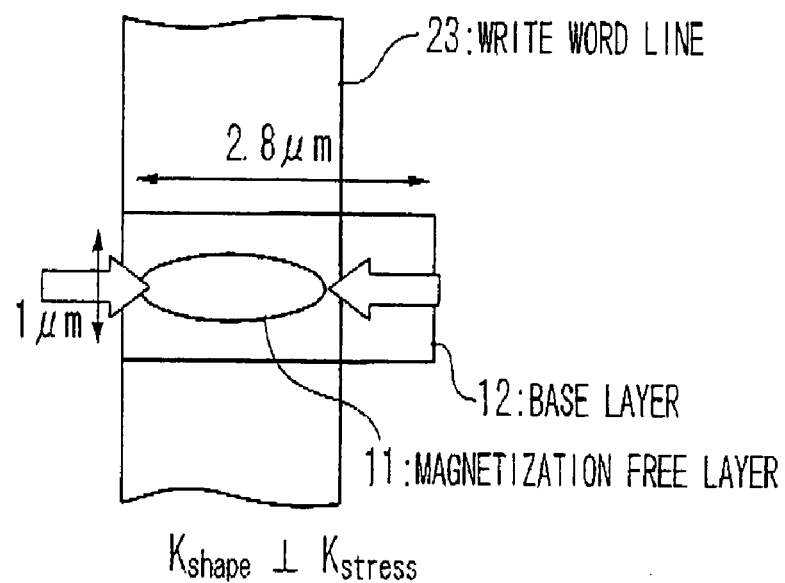
FIG. 15B is a plan view showing a structure of a sample which is controlled such that the shape magnetic anisotropy and the stress inducing magnetic anisotropy are made vertical, depending on the extending direction of the write word line 23.
Figure 16A:
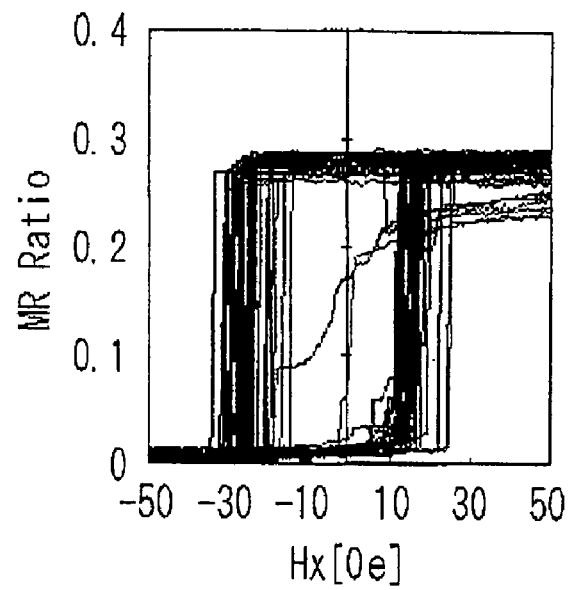
FIG. 16A is a graph showing an MR curve of the sample of FIG. 15A.
Figure 16B:
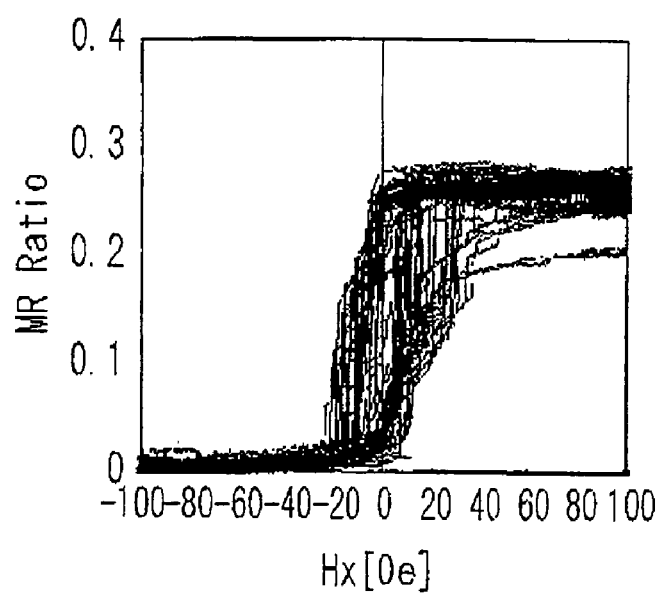
FIG. 16B is a graph showing an MR curve of the sample of FIG. 15B.

FIGS. 16A and 16B are the MR curve of the MTJ shown in FIG. 15A and the MR curve of the MTJ in FIG. 15B, respectively. As shown in FIG. 16B, in the case of MTJ shown in FIG. 11B, in which the stress inducing magnetic anisotropy of the magnetization free layer 11 was orthogonal to the direction of the shape magnetic anisotropy, the pinning of the magnetic domain wall movement was remarkably generated, and the variation in its switching field was great. Specifically, in the case of MTJ shown in FIG. 15B, an average value of the switching fields was 12 (Oe), and the standard deviation of the switching fields was 62% of the average value. On the other hand, as shown in FIG. 16A, in the case of MTJ shown in FIG. 11A, in which the stress inducing magnetic anisotropy of the magnetization free layer 11 was parallel to the shape magnetic anisotropy, the MR curve whose square deviation was excellent was generated, and the variation in its switching field was relatively small. Specifically, in the case of MTJ shown in FIG. 11A, the average value of the switching fields was 21 (Oe), and the standard deviation of the switching fields was 21% of the average value. The graphs of FIGS. 16A and 16B show the effectiveness of the technique that controls the direction of the stress inducing magnetic anisotropy on the basis of the extension direction of the wiring located lower than the base layer; and the polarity of the magnetic strain constant λs of the magnetization free layer 11.

FOURTH EMBODIMENT

In the magnetic memory, the structure that applies the stress to the magnetization free layer in an undesirable direction may exist. Such existence of the structure causes the stress inducing magnetic anisotropy of the magnetization free layer to be generated in an unsuitable direction and brings about the variation in the switching field of the magnetization free layer. For example, in the magnetic memory that employs the one-axis write or toggle write, the wiring supplied with the write current applies the stress to the magnetization free layer in the undesirable direction. This is because those write methods are required to be arranged to extend obliquely to the easy axis of the magnetization free layer (namely, the direction of the shape magnetic anisotropy). The obliquely extending wiring applies the stress to the magnetization free layer in its extension direction or the direction orthogonal thereto. In any event, the direction of the stress magnetic anisotropy of the magnetization free layer is made different from the direction of the shape magnetic anisotropy. This involves the variation in the switching field of the magnetization free layer.

The fourth embodiment provides a structure of the magnetic memory to cope with the existence of the structure for applying the stress to the magnetization free layer in the undesirable direction. Specifically, in the magnetic memory in this embodiment, a first stress inducing structure for canceling the stress in the undesirable direction and a second stress inducing structure for applying the stress to the magnetization free layer in the desirable direction are provided differently from each other. As the first and second stress inducing structures, two of the three structures of the stress inducing layer; the base layer; and the wiring may be used. The structure of the magnetic memory in this embodiment will be described below in detail.

Figure 17A:
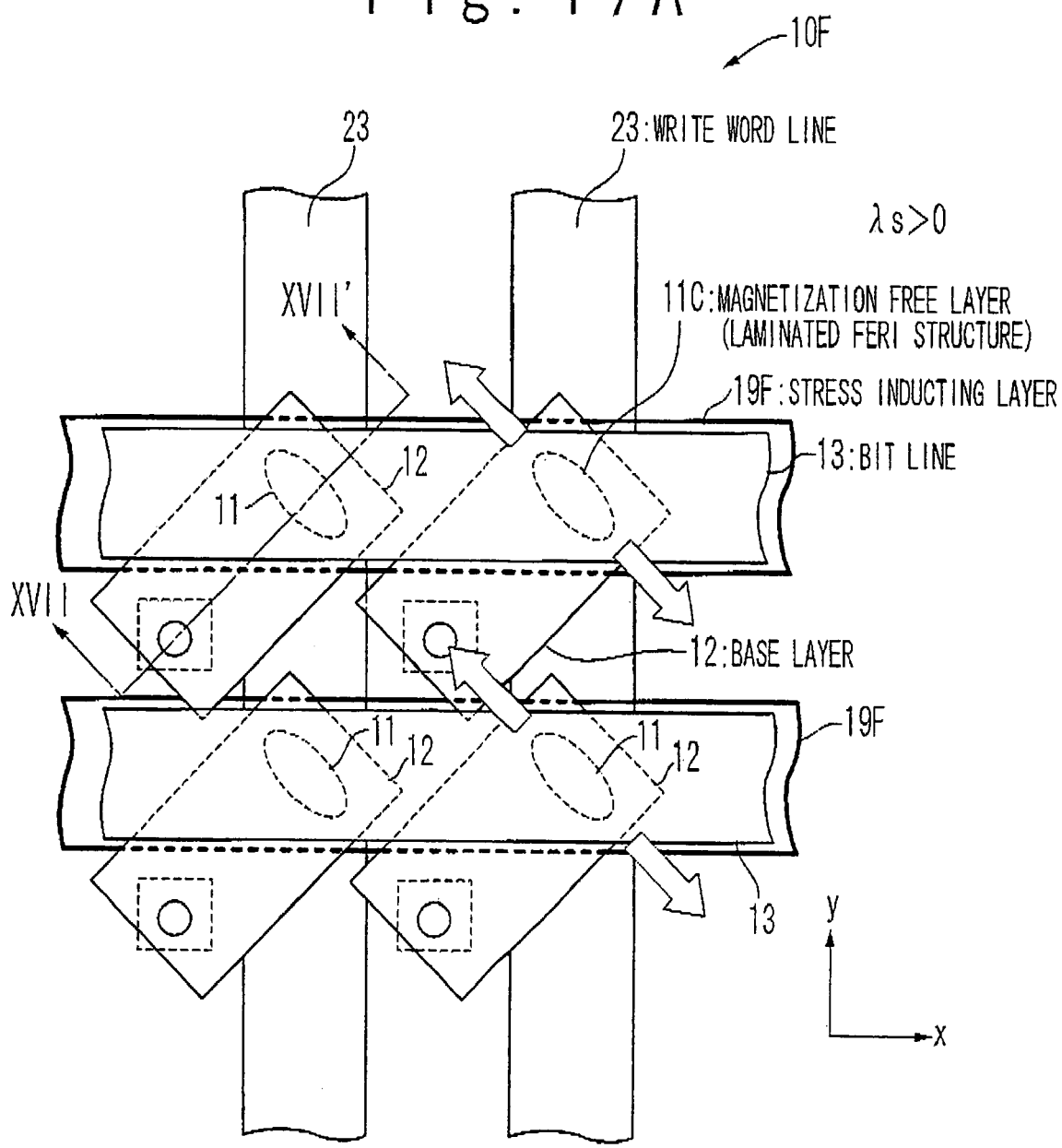
FIG. 17A is a plan view showing a structure of a magnetic memory according to a fourth embodiment of the present invention.
Figure 17B:
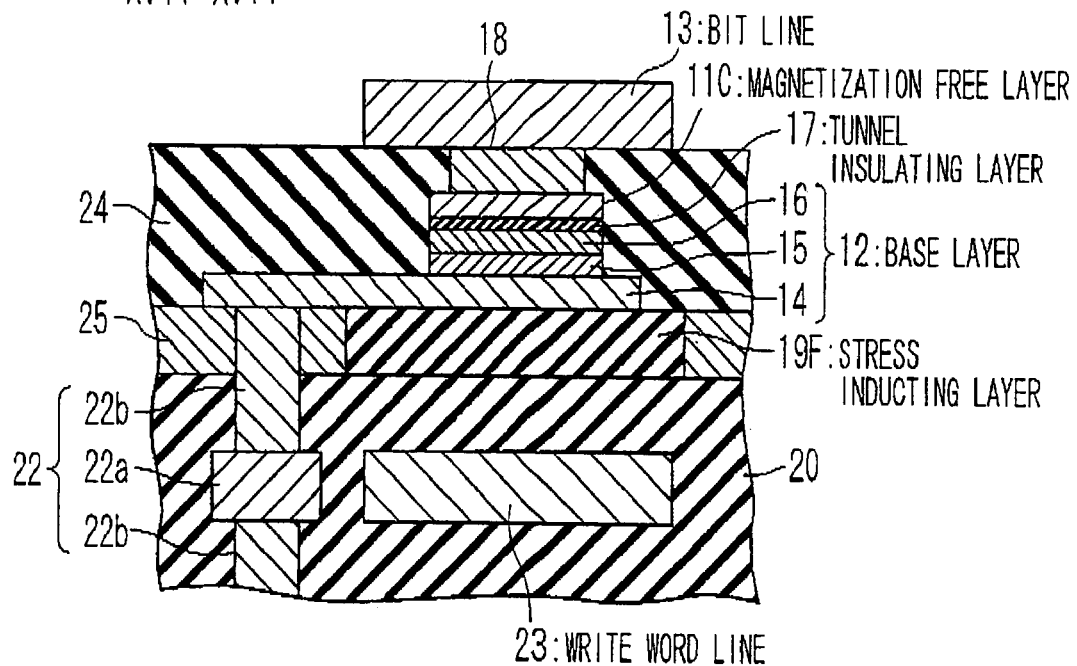
FIG. 17B is a sectional view showing the structure of the magnetic memory according to the fourth embodiment of the present invention.

FIGS. 17A and 17B show the structure of a magnetic memory cell 10F of the magnetic memory in the fourth embodiment. The magnetic memory cell 10F has a configuration for performing the toggle write. Specifically, as shown in FIG. 17A, in the magnetic memory cell 10F, the bit line 13 extends in the x-axis direction, and the write word line 23 extends in the y-axis direction. The magnetization free layer 11C and the base layer 12 are formed at the position at which the bit line 13 and the write word line 23 intersect. As the magnetization free layer 11C, the laminated feri structure is used that is formed from a plurality of ferromagnetic layers separated by non-magnetic layers. The magnetization free layer 11C has a shape long in the direction of 45° with respect to both of the x-axis direction and the y-axis direction. Thus, the shape magnetic anisotropy of the magnetization free layer 11C is in the direction of 45° with respect to both of the x-axis direction and the y-axis direction.

Figure 17C:
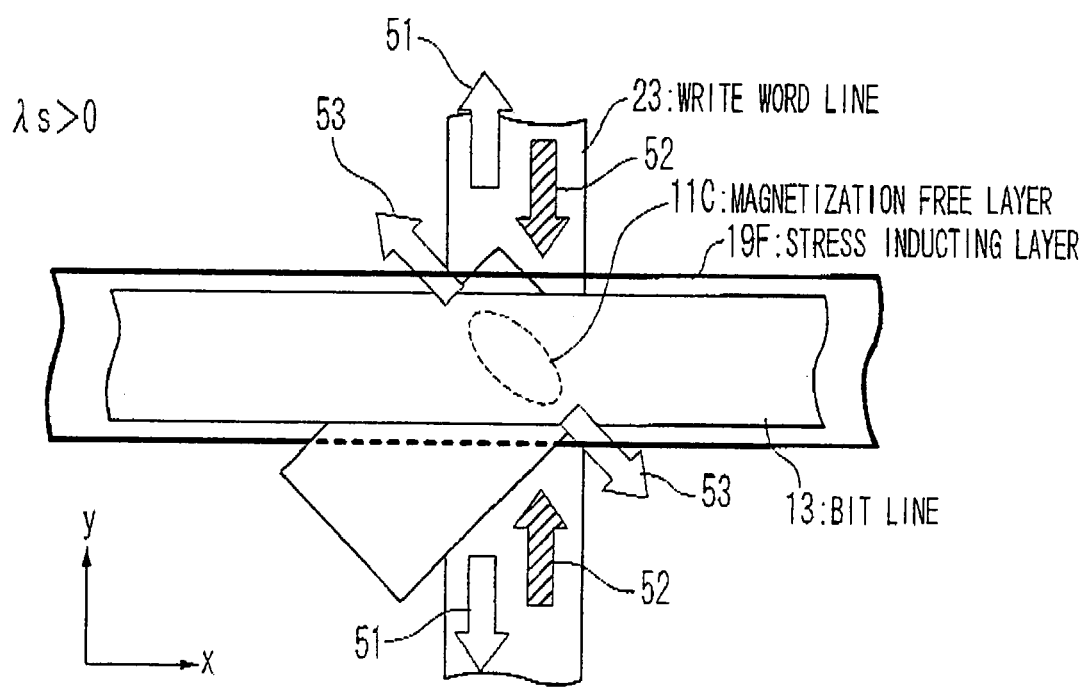
FIG. 17C is a concept view showing directions of various stresses that are applied to a magnetization free layer, in the magnetic memory of the fourth embodiment.

As shown in FIG. 17C, the write word line 23 extending in the y-axis direction applies a tensile stress 51 to the magnetization free layer 11C in the y-axis direction. It should be noted that the extension direction of the write word line 23 is oblique to the direction of the shape magnetic anisotropy of the magnetization free layer 11C. Since the extension direction of the write word line 23 is oblique, the stress in the undesirable direction, specifically, the stress oblique to the direction of the shape magnetic anisotropy is applied to the magnetization free layer 11C, as mentioned above.

In order to cancel the stress in the undesirable direction that is applied to the magnetization free layer 11C by the write word line 23, a stress inducing layer 19F whose inner stress is the tensile stress is formed to extend in the x-axis direction, as shown in FIG. 17A. As shown in FIG. 17B, the stress inducing layer 19F is formed on the interlayer insulating layer 20 and located between the write word line 23 and the magnetization free layer 11C. The base layer 12 is formed on this stress inducing layer 19F. The stress inducing layer 19F is made of an insulative material.

As shown in FIG. 17C, the stress inducing layer 19F applies a compression stress 52 to the magnetization free layer 11C in the y-axis direction and plays a role to cancel the tensile stress that is generated in the y-axis direction by the write word line 23. The magnitude of the stress generated by the stress inducing layer 19F is controlled in accordance with the thickness of the stress inducing layer 19F. The thickness of the stress inducing layer 19F is defined in accordance with the magnitude of the stress generated by the write word line 23.

In addition, the base layer 12 is used as the stress inducing structure for applying the stress to the magnetization free layer 11C in the suitable direction. In other words, the direction of the stress inducing magnetic anisotropy of the magnetization free layer 11C is controlled by the base layer 12. The polarity of the magnetic strain constant λs of the magnetization free layer 11C, the polarity of the inner stress of the base layer 12, and the shape of the base layer 12 are selected, as described in the second embodiment. Specifically, when the magnetic strain constant λs of the magnetization free layer 11C is positive, the base layer 12 is formed such as its inner stress is the compression stress and its shape is long in the y-axis direction. Thus, a tensile stress 53 is applied to the magnetization free layer 11C in its longitudinal direction. Ideally, the direction of the stress inducing magnetic anisotropy of the magnetization free layer 11C is made coincident with the direction of the shape magnetic anisotropy. Instead, the base layer 12 may be formed such that its inner stress is the tensile stress and its shape is long in the x-axis direction. On the other hand, when the magnetic strain constant λs of the magnetization free layer 11 is negative, the base layer 12 is formed such that its inner stress is the tensile stress and its shape is long in the x-axis direction. Instead, the base layer 12 may be formed such that its inner stress is the compression stress and its shape is long in the y-axis direction.

Figure 18A:
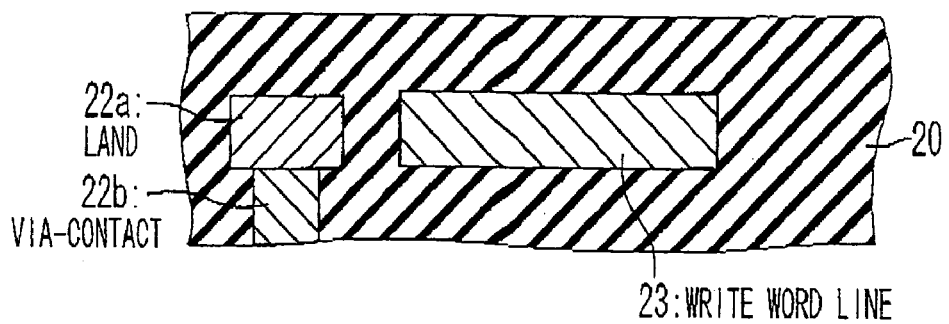
FIG. 18A is a plan view showing a manufacturing step of the magnetic memory shown in FIG. 17A and FIG. 17B.

FIGS. 18A to 18G are sectional views showing a manufacturing method of the magnetic memory with a memory cell 10F shown in FIGS. 17A and 17B. As shown in FIG. 18A, the write word line 23, the land 22a and the via-contact 22c are formed inside the interlayer insulating layer 20 that covers the substrate (not shown). The write word line 23 is formed to extend in the y-axis direction. The interlayer insulating layer 20 is made of $SiO_2$.

Figure 18B:
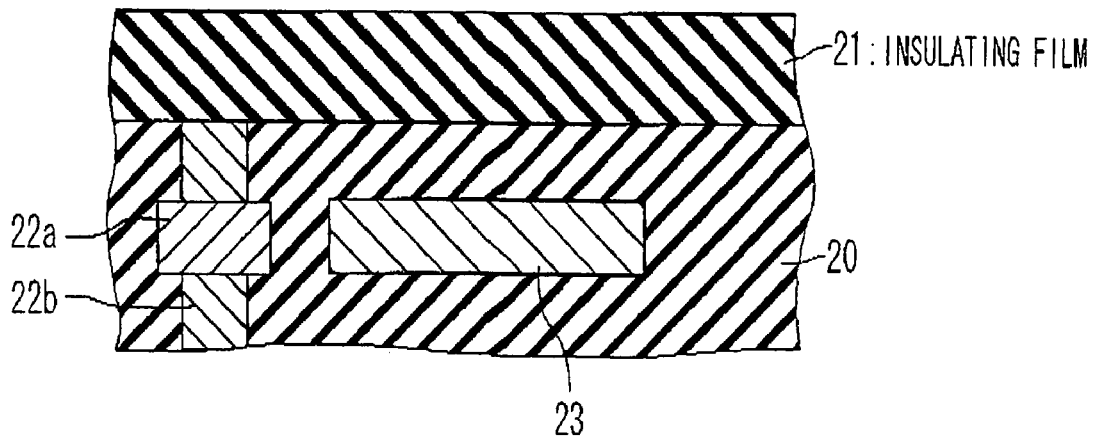
FIG. 18B is a plan view showing the manufacturing step of the magnetic memory shown in FIG. 17A and FIG. 17B.

Subsequently, as shown in FIG. 18B, the insulting film 21 is formed on the interlayer insulating layer 20. The insulting film 21 is the layer that is processed to the stress inducing layer 19F by the later steps. The insulating film 21 is formed such that thermal stress in the tensile direction is induced therein. Specifically, the insulating film 21 is made of a material, which is greater in thermal expansion coefficient than that of $SiO_2$ and hard, for example, is made from a nitride film or boride film while the substrate is heated. The film formation temperature of the insulting film 21 is typically between 350 and 400° C.

Figure 18C:
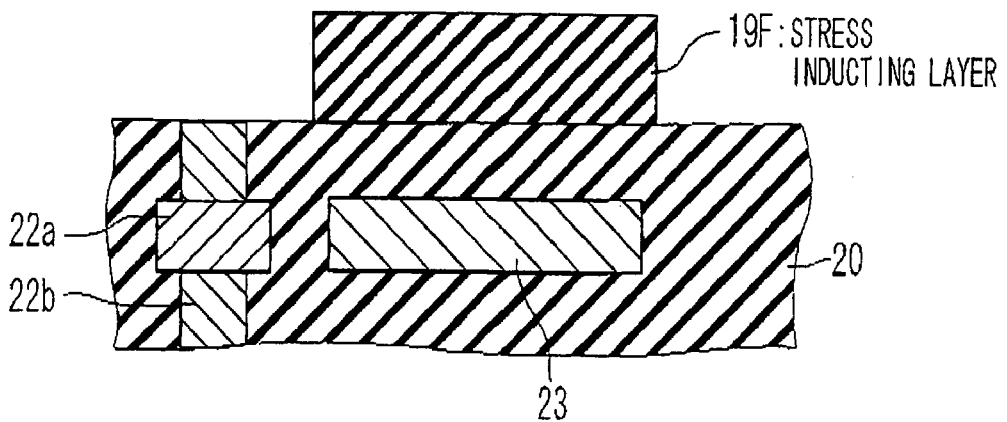
FIG. 18C is a sectional view showing the manufacturing step of the magnetic memory shown in FIG. 17A and FIG. 17B.
Figure 18D:
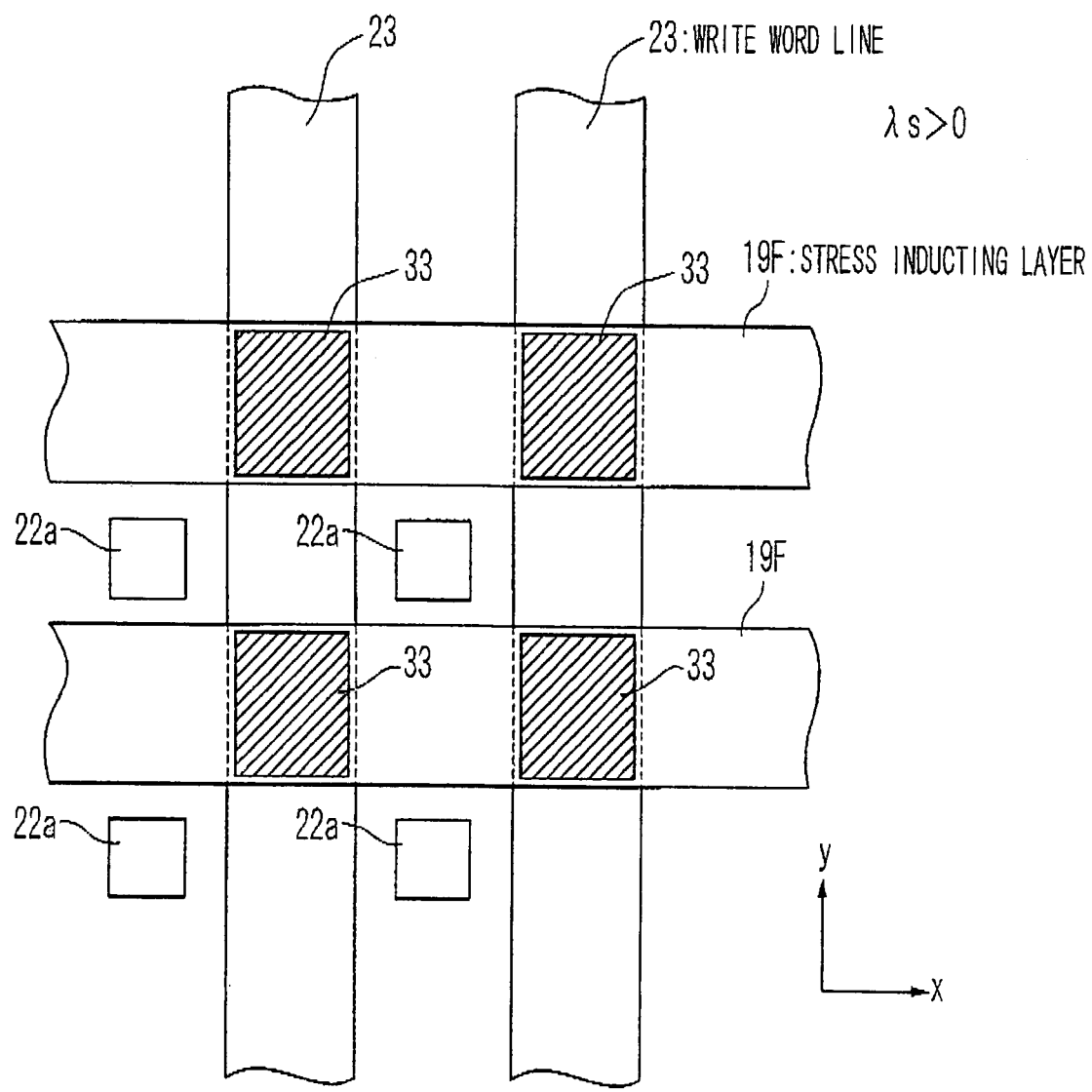
FIG. 18D is a sectional view showing the manufacturing step of the magnetic memory shown in FIG. 17A and FIG. 17B.

Subsequently, as shown in FIG. 18C, the insulting film 21 is patterned and the stress inducing layer 19 is formed. As shown in FIG. 18D, the insulting film 21 is patterned such that the stress inducing layer 19F extends in the x-axis direction. A region 33 in which the stress inducing layer 19F and the write word line 23 intersect is a region in which the magnetization free layer 11C is formed in the later steps. In the region 33, the tensile stress generated in the y-axis direction by the write word line 23 and the compression stress generated in the y-axis direction by the stress inducing layer 19 are canceled. Thus, the magnetization free layer 11C does not receive the influence of the stress generated by the write word line 23.

Figure 18E:
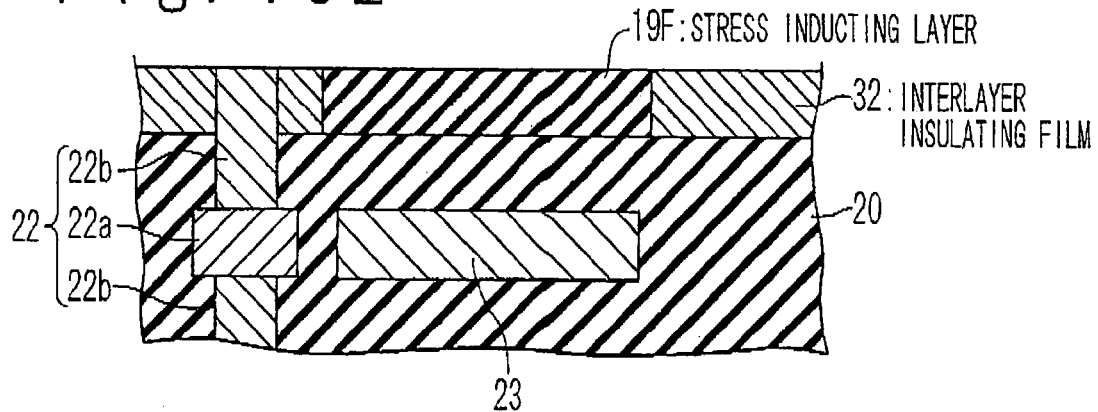
FIG. 18E is a sectional view showing the manufacturing step of the magnetic memory shown in FIG. 17A and FIG. 17B.

Subsequently, as shown in FIG. 18E, after a portion between the stress inducing layers 19 is embedded with an interlayer insulating layer 32, the via-contact 22b is formed to pass through the interlayer insulating layer 32 to the land 22A. Thus, the contact 22 is completed.

Figure 18F:
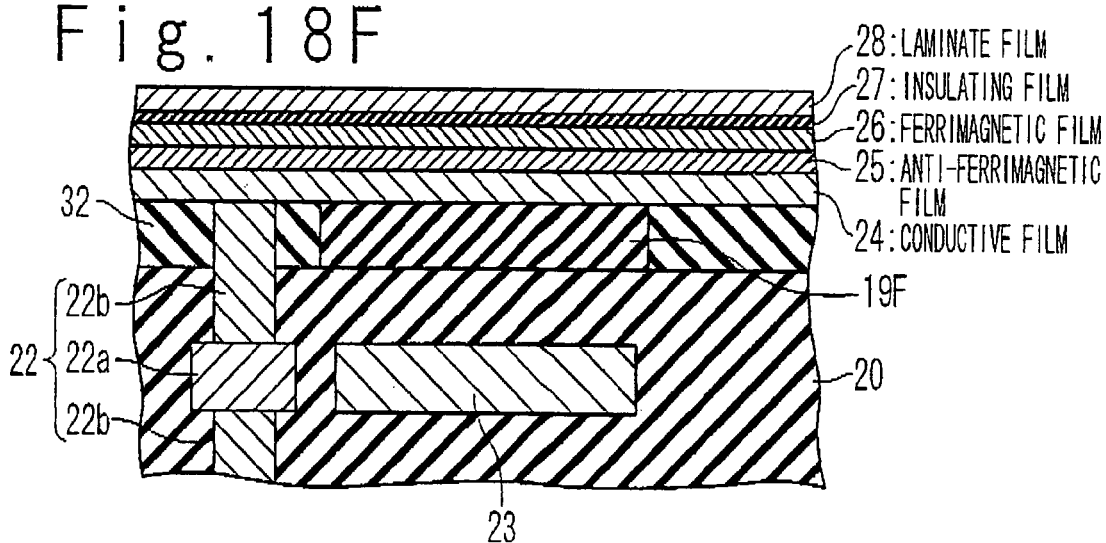
FIG. 18F is a sectional view showing the manufacturing step of the magnetic memory shown in FIG. 17A and FIG. 17B.

Subsequently, as shown in FIG. 18F, a conductive film 24, an anti-ferromagnetic film 25, a ferromagnetic film 26, an extremely thin insulting film 27, and a laminate film 28 composed of a plurality of ferromagnetic films separated from each other by non-magnetic layers are sequentially formed. As described later, the conductive film 24, the anti-ferromagnetic film 25, the ferromagnetic film 26, the insulting film 27 and the laminate film 28 are films which are processed to the lower electrode layer 14, the anti-ferromagnetic layer 15, the magnetization pinned layer 16, the tunnel insulating layer 17 and the magnetization free layer 11C, respectively, through the steps which are subsequently performed.

Figure 18G:
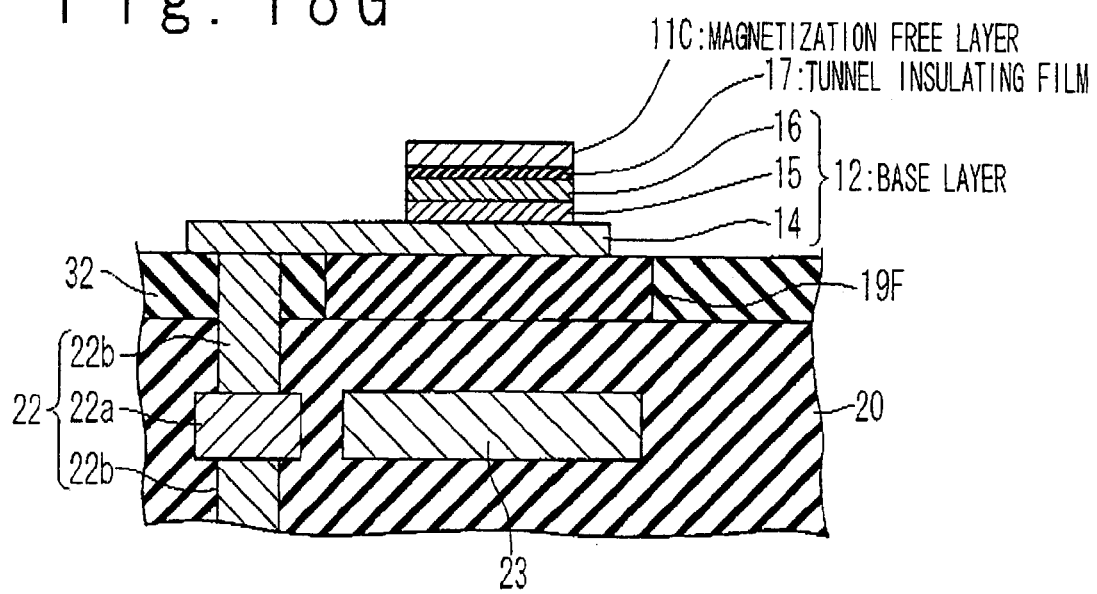
FIG. 18G is a sectional view showing the manufacturing step of the magnetic memory shown in FIG. 17A and FIG. 17B.

Subsequently, as shown in FIG. 18G, the insulting film 27 and the laminate film 28 are patterned, and the tunnel insulating layer 17 and the magnetization free layer 11C are formed. The conductive film 24, the anti-ferromagnetic film 25 and the ferromagnetic film 26 are patterned and the base layer 12 is formed. Moreover, after the magnetization free layer 11C and the base layer 12 are covered with the interlayer insulating film 31, the via-contact 18 and the bit line 13 are formed, to complete the magnetic memory cell 10F shown in FIGS. 17A and 18B.

It should be noted that the shape of the stress inducing layer 19F is defined in accordance with the inner stress. The stress inducing layer 19F can be formed such that its inner stress is the compression stress and extends in the same y-axis direction as the write word line 23.

Figure 18H:
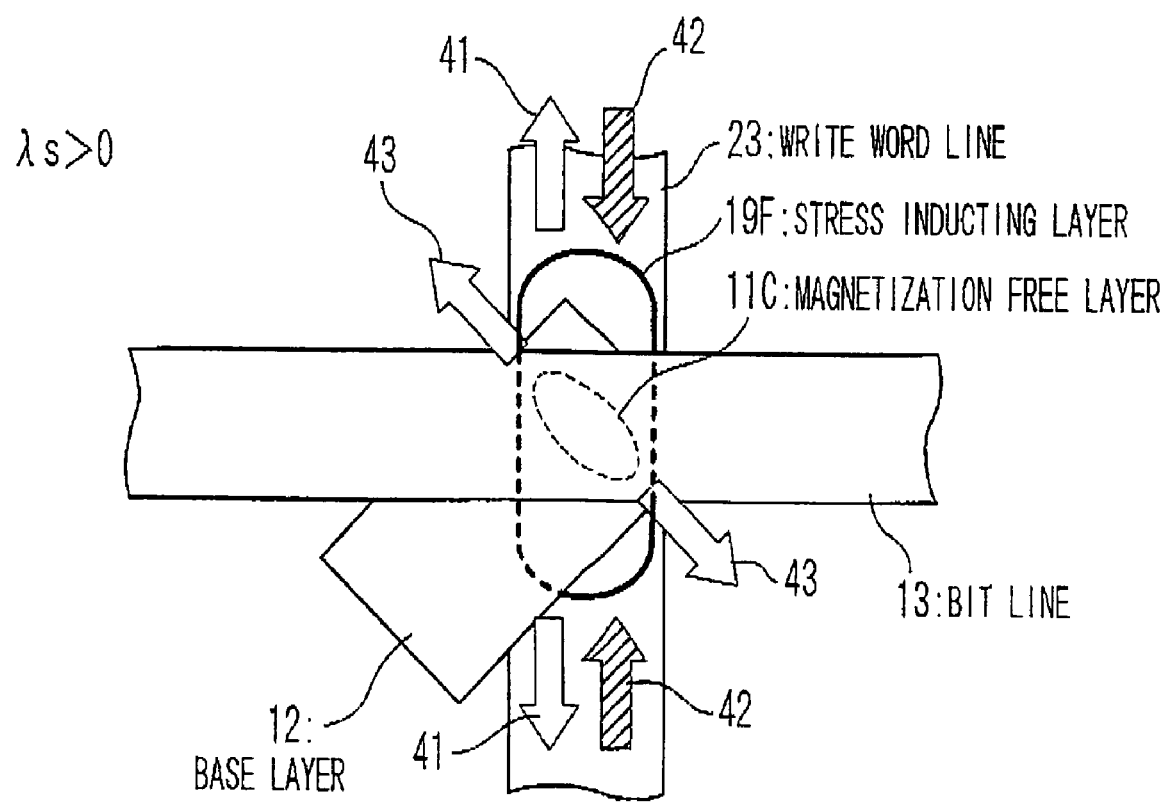
FIG. 18H is a plan view showing another structure of the magnetic memory according to the fourth embodiment of the present invention, and a plan view showing the manufacturing step of the magnetic memory shown in FIG. 5A to FIG. 5C.

Subsequently, the stress inducing layer 19F can be made of a conductive material without using an insulative material. In this case, the stress inducing layers 19F are formed correspondingly to one base layer 12 and electrically separated from each other. FIG. 18H is a plan view showing the configuration of the magnetic memory in which the stress inducing layer 19F is made of the conductive material so that the inner stress is the compression stress. In the magnetic memory shown in FIG. 18H, It should be noted that the stress inducing layer 19F has the shape long in the y-axis direction, and the stress inducing layer 19F are separated from each other.

Figure 19A:
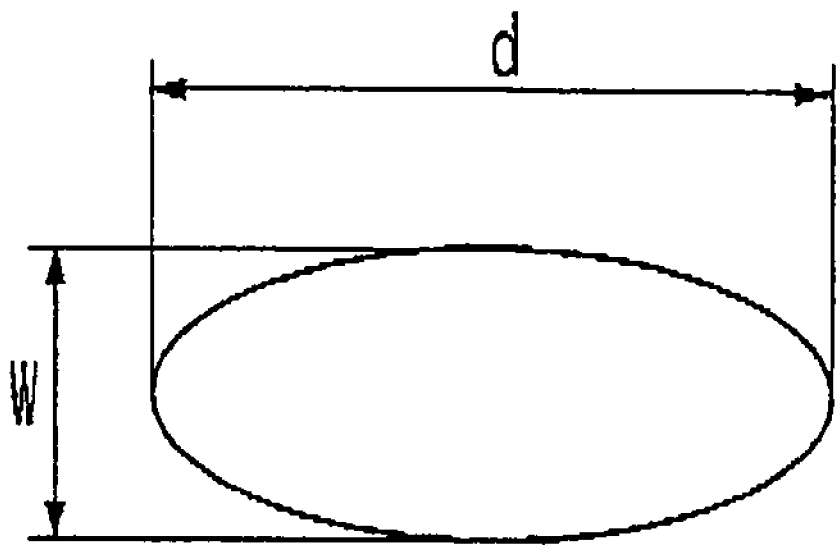
FIG. 19A is a concept view explaining a definition of an aspect ratio of the magnetization free layer.

In the magnetic memory in the above-mentioned embodiments, in order to reduce the variation in the switching field of the magnetization free layer while decreasing the size of the memory cell, it is effective to increase the contribution of the stress inducing magnetic anisotropy among the magnetic anisotropies of the magnetization free layer 11. Specifically, it is effective to select a ratio $H_{STR}/H_{SH}$ between an anisotropic magnetic field $H_{STR}$ (hereafter, referred to as "stress inducing anisotropy magnetic field $H_{STR}$") caused by the stress inducing magnetic anisotropy and an anisotropic magnetic field $H_{SH}$ (hereafter, referred to as "shaped anisotropy magnetic Field $H_{SH}$" caused by the shape magnetic anisotropy to 0.5 or more while suppressing the aspect ratio of the magnetization free layer 11 to 2.0 or less. Here, an aspect ratio of the magnetization free layer 11 is a value defined as d/W by using the length d of the longitudinal direction (namely, the direction of the shape magnetic anisotropy) and the width W of the direction orthogonal to the longitudinal direction, as shown in FIG. 19A.

Figure 19B:
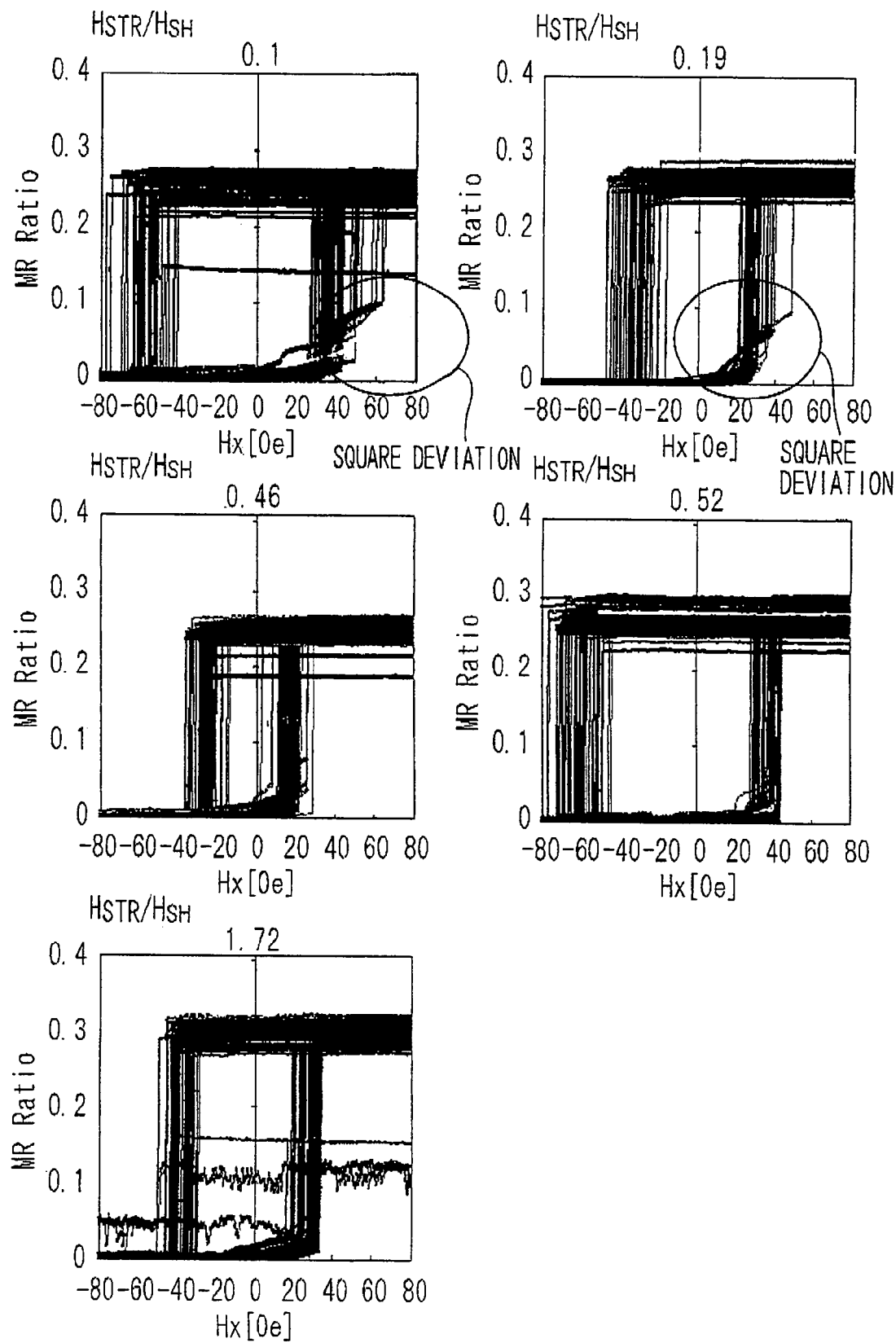
FIG. 19B is a view showing an influence on the MR curve of a ratio between a stress inducing anisotropy magnetic field and a shape magnetic anisotropy magnetic field.

FIG. 19B is diagrams showing the result of the experiment, which proves the consideration of the inventor, and indicates the influence of the ratio $H_{STR}/H_{SH}$ on the shape of the MR curve of the magnetization free layer. In the experiment, the MR curve of the magnetization free layer made of $Ni_{81}Fe_{19}$ having the width of 0.2 μm and the length of 0.5 μm is measured. The magnetization free layer is formed such that its aspect ratio is about 2 and the directions of the stress inducing magnetic anisotropy and the shape magnetic anisotropy are coincident. The ratio $H_{STR}/H_{SH}$ between the stress inducing anisotropy magnetic field $H_{STR}$ and the shaped anisotropy magnetic field $H_{SH}$ is selected from a range between 0.1 and 1.72.

As shown in FIG. 19B, in the magnetization free layer whose ratio $H_{STR}/H_{SH}$ is 0.19 or less, the pinning of the magnetic domain wall movement is remarkably generated, and the square deviation of the MR curve is low. On the other hand, in the magnetization free layer whose ratio $H_{STR}/H_{SH}$ is larger than 0.5, the reduction in the square deviation caused by the pinning of the magnetic domain wall movement is suppressed. This implies that the ratio $H_{STR}/H_{SH}$ to 0.5 or more can reduce the variation in the switching field of the magnetization free layer, even if the aspect ratio of the magnetization free layer is 2.0 or less.

One means to enlarge the contribution of the stress inducing magnetic anisotropy, namely, to increase the ratio $H_{STR}/H_{SH}$ is to use the material whose saturation magnetization M is small. This could be understood from the fact that the shape anisotropy magnetic field $H_{SH}$ is represented by the following equations.

$$H_{SH}=4\pi M \cdot t/W$$

$$H_{STR}=3\sigma\lambda/M$$

Here, W is the width of the magnetization free layer, t is the thickness of the magnetization free layer, σ is the stress applied to the magnetization free layer, and λ is the saturation magnetization strain. The foregoing two equations indicate that the shape anisotropy magnetic field $H_{SH}$ becomes smaller as the saturation magnetization M becomes smaller and the stress inducing anisotropy magnetic field $H_{STR}$ becomes larger as the saturation magnetization M becomes smaller.

Another preferable method to reduce the variation in the switching field of the magnetization free layer is to suitably determine a ratio between the stress inducing anisotropy magnetic field $H_{STR}$ and the shape anisotropy magnetic field $H_{SH}$, on the basis of the values of the respective variations in the stress inducing anisotropy magnetic field $H_{STR}$ and the shape anisotropy magnetic field $H_{SH}$. Specifically, to satisfy the relations represented by the following items (a), (b) and equations (1), (2a), (2b) and (3), it is preferable to form the magnetization free layer in order to reduce the variation in the switching field of the magnetization free layer:

(a) the stress inducing anisotropy magnetic field $H_{STR}$ and the shape anisotropy magnetic field $H_{SH}$ have no correlation, and
(b) the parameter r defined by the following equation (1) and $b_{STR}$ and $b_{SH}$ defined by the following equations (2a) and (2b) establish the relation represented by the equation (3)

$$r=A_{SH}/(A_{STR}+A_{SH}) \quad (1)$$

$$b_{STR}=\sigma_{STR}/A_{STR} \quad (2a)$$

$$b_{SH}=\sigma_{SH}/A_{SH} \quad (2b)$$

$$r=b_{ST}^2/(b_{STR}^2+b_{SH}^2) \quad (3)$$

Here, $A_{STR}$ is an average value of the stress inducing anisotropy magnetic fields $H_{STR}$, $A_{SH}$ is an average value of the shape anisotropy magnetic fields $H_{SH}$, $\sigma_{STR}$ is a standard deviation of the stress inducing anisotropy magnetic fields $H_{STR}$, and $\sigma_{SH}$ is a standard deviation of the shape anisotropy magnetic fields $H_{SH}$. It should be noted that the parameter r is a ratio between the average value $A_{SH}$ of the shaped anisotropy magnetic fields $H_{SH}$, and a sum of the average value $A_{STR}$ of stress inducing anisotropy magnetic fields $H_{STR}$ and the average value $A_{SH}$ of the shape anisotropy magnetic fields $H_{SH}$, and $b_{STR}$ and $b_{SH}$ imply the variations in the stress inducing anisotropy magnetic field $H_{STR}$ and the shape anisotropy magnetic field $H_{SH}$, which are ruled under the average values, respectively.

Figure 20:
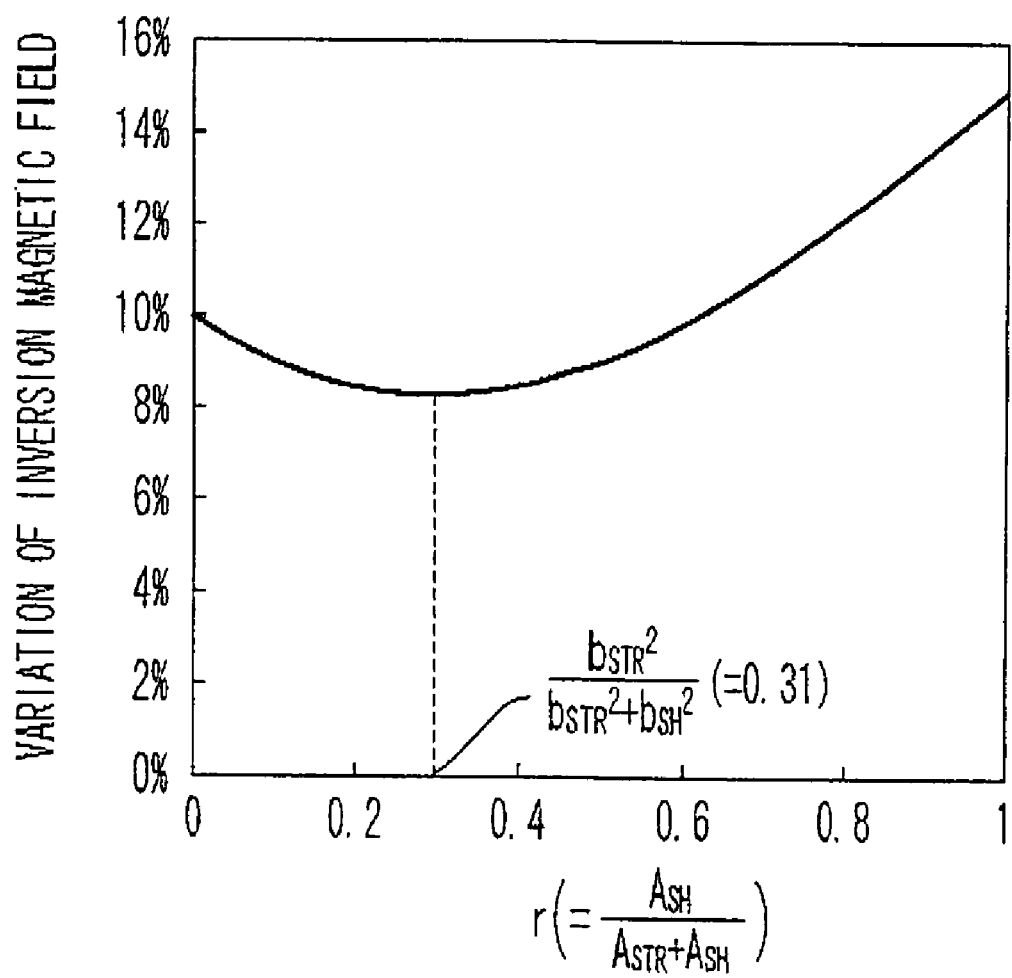
FIG. 20 is a graph showing a change in a variation in a switching field of the magnetization free layer, which results from a parameter r corresponding to the ratio between the stress inducing anisotropy magnetic field and the shape magnetic anisotropy magnetic field.

FIG. 20 is a graph showing the dependence of the variation in the switching field of the magnetization free layer (namely, the value when the standard deviation of the switching field of the magnetization free layer is divided by the average value) on the parameter r, when the stress inducing anisotropy magnetic field $H_{STR}$ and the shape anisotropy magnetic field $H_{SH}$ have no correlation. The graph of FIG. 20 is a graph when $b_{STR}$ is 10% (=0.1) and $b_{SH}$ is 15% (=0.15), and the graph is obtained as a result of calculation. The variation in the switching field of the magnetization free layer has the minimal value when the parameter r is $r=b_{ST}^2/(b_{STR}^2+b_{SH}^2)$. For example, in case of $b_{STR}$ of 10% and $b_{SH}$ of 15%, r is about 0.31 when the variation in the switching field of the magnetization free layer is minimal. It can be mathematically proved that the variation in the switching field of the magnetization free layer has the minimal value when the parameter r is $r=b_{ST}^2/(b_{STR}^2+b_{SH}^2)$.

This idea can be applied to a relation between the stress inducing magnetic anisotropy and a crystal magnetic anisotropy and even a relation between the shape magnetic anisotropy and the crystal magnetic anisotropy. Specifically, as for the two magnetic anisotropies (hereafter, one is referred to as "first magnetic anisotropy" and the other is referred to as "second magnetic anisotropy") selected from the stress inducing magnetic anisotropy, the shape magnetic anisotropy and the crystal magnetic anisotropy, the magnetization free layer is preferably formed to establish the following relations:

(a') the anisotropic magnetic fields resulting from the two magnetic anisotropies have no correlation from each other, and
(b') a parameter r defined by the following equation (1') and $b_X$ and $b_Y$ defined by the following equations (2a') and (2b'), respectively, establish the relation indicated by the following equation (3'), $$r=A_Y/(A_X+A_Y) \quad (1')$$

$$b_X=\sigma_X/A_X \quad (2a')$$

$$b_Y=\sigma_Y/A_Y \quad (2b')$$

$$r=b_X^2/(b_X^2+b_Y^2) \quad (3')$$

Here, $A_X$ is an average value of the anisotropic magnetic fields $H_X$ resulting from the first magnetic anisotropy, and $A_Y$ is an average value of the anisotropic magnetic fields $H_Y$ resulting from the second magnetic anisotropy. Also, $\sigma_X$ is a standard deviation of the anisotropic magnetic fields $H_X$ resulting from the first magnetic anisotropy, and $\sigma_Y$ is a standard deviation of the anisotropic magnetic fields $H_Y$ resulting from the second magnetic anisotropy. The establishment of the relations (a') and (b') can reduce the variation in the switching field of the magnetization free layer.

The invention claimed is:
1. A magnetic memory comprising:
  a magnetization free layer including a ferromagnetic layer having a shape magnetic anisotropy in a first direction and a magnetic strain constant is positive; and a stress inducing structure configured to apply a tensile stress to said magnetization free layer in a same direction as the first direction;

a space layer; and a base layer having a magnetization pinned layer that is provided to be opposite to said magnetization free layer with respect to said spacer layer, wherein said stress inducing structure comprises a stress inducing layer that is provided separately from said base layer, said base layer being separated from said stress inducing layer by an interlayer insulating film directly therebetween.

2. The magnetic memory according to claim 1, wherein said base layer is provided to extend in a direction oblique to the first direction.

3. The magnetic memory according to claim 1, further comprising:

a substrate above which said magnetization free layer and said stress inducing layer are formed, said magnetization free layer being above said stress inducing layer; and a lower wiring provided between said magnetization free layer and said substrate and supplied with a write current to reverse a direction of magnetization of said magnetization free layer, wherein said stress inducing layer is provided separately from said lower wiring.

4. A magnetic memory comprising;

a magnetization free layer including a ferromagnetic layer having a shape dependent magnetic anisotropy in a first direction and a magnetic strain constant is positive;

a stress inducing structure configured to apply a tensile stress to said magnetization free layer in a same direction as the first direction;

a spacer layer connected with said magnetization free layer, wherein said stress inducing structure comprises a base layer having a magnetization pinned layer that is provided to be opposite to said magnetization free layer with respect to said spacer layer; and an interlayer insulating layer directly between said base layer and a bottommost layer of said stress inducing structure.

5. A magnetic memory comprising:

a magnetization free layer including a ferromagnetic layer having a shape magnetic anisotropy in a first direction and a magnetic strain constant is positive;

a stress inducing structure configured to apply a tensile stress to said magnetization free layer in a same direction as the first direction;

a spacer layer; and a base layer having a magnetization pinned layer that is provided to be opposite to said magnetization free layer with respect to said spacer layer, wherein said base layer comprises a protrusion formed to extend in a third direction oblique to the first direction and to protrude in the third direction, and said protrusion functions as said stress inducing structure.

6. A magnetic memory comprising;

a magnetization free layer including a ferromagnetic layer having a shape magnetic anisotropy in a first direction and a magnetic strain constant is negative;

a stress inducing structure configured to apply a compression stress to said magnetization free layer in a same direction as the first direction;

a spacer layer; and a base layer having a magnetization pinned layer that is provided to be opposite to said magnetization free layer with respect to said spacer layer, wherein said stress inducing structure comprises a stress inducing layer that is provided separately from said base layer, said base layer being separated from said stress inducing layer by an interlayer insulating film directly therebetween.

7. The magnetic memory according to claim 6, wherein said base layer is provided to extend in a direction oblique to the first direction.

8. The magnetic memory according to claim 6, further comprising:

a substrate above which said magnetization free layer and said stress inducing layer are formed; and a lower wiring provided between said magnetization free layer and said substrate and supplied with a write current to reverse a direction of magnetization of said magnetization free layer, wherein said stress inducing layer is provided separately from said lower wiring.

9. A magnetic memory comprising:

a magnetization free layer including a ferromagnetic layer having a shape magnetic anisotropy in a first direction and a magnetic strain constant is negative;

a stress inducing structure configured to apply a compression stress to said magnetization free layer in a same direction as the first direction;

a spacer layer connected with said magnetization free layer, wherein said stress inducing structure comprises a base layer having a magnetization pinned layer that is provided to be opposite to said magnetization free layer with respect to said spacer layer; and an interlayer insulating layer directly between said base layer and a bottommost layer of said stress inducing structure.

10. A magnetic memory comprising:

a magnetization free layer including a ferromagnetic layer having a shape magnetic anisotropy in a first direction and a magnetic strain constant is negative;

a stress inducing structure configured to apply a compression stress to said magnetization free layer in a same direction as the first direction;

a spacer layer; and a base layer having a magnetization pinned layer that is provided to be opposite to said magnetization free layer with respect to said spacer layer, wherein said base layer comprises a protrusion formed to extend in a third direction oblique to the first direction and to protrude in the third direction, and said protrusion functions as said stress inducing structure.

* * * * *